US012575096B2

(12) United States Patent
Zhang et al.

(10) Patent No.: US 12,575,096 B2
(45) Date of Patent: Mar. 10, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Wenxi Zhou, Wuhan (CN); Shuangshuang Wu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 780 days.

(21) Appl. No.: 17/843,636

(22) Filed: Jun. 17, 2022

(65) Prior Publication Data

US 2023/0413541 A1     Dec. 21, 2023

(51) Int. Cl.
*H10B 41/27* (2023.01)
*H10B 41/30* (2023.01)

(52) U.S. Cl.
CPC ............. *H10B 41/27* (2023.02); *H10B 41/30* (2023.02)

(58) Field of Classification Search
CPC ......... H10B 41/27; H10B 41/30; H10B 43/27
See application file for complete search history.

(56) References Cited

U.S. PATENT DOCUMENTS

| | | | | |
|---|---|---|---|---|
| 2015/0123189 A1* | 5/2015 | Sun | ...................... | H10D 30/689 |
| | | | | 438/258 |
| 2016/0204122 A1* | 7/2016 | Shoji | ...................... | H10B 43/50 |
| | | | | 257/314 |
| 2019/0006014 A1 | 1/2019 | Harari | | |
| 2020/0365192 A1 | 11/2020 | Koike et al. | | |
| 2021/0366544 A1 | 11/2021 | Harari | | |
| 2022/0052063 A1 | 2/2022 | Yamashita | | |
| 2022/0077283 A1 | 3/2022 | Wu et al. | | |

FOREIGN PATENT DOCUMENTS

| | | | | | |
|---|---|---|---|---|---|
| CN | 111801800 A | * | 10/2020 | ............. | H10B 41/27 |
| TW | 201515239 A | | 4/2015 | | |
| TW | 202034509 A | | 9/2020 | | |
| TW | 202111925 A | | 3/2021 | | |
| TW | 202203427 A | | 1/2022 | | |
| TW | 202211385 A | | 3/2022 | | |

* cited by examiner

*Primary Examiner* — Matthew C Landau
*Assistant Examiner* — Dmitriy Yemelyanov
(74) *Attorney, Agent, or Firm* — BAYES PLLC

(57) ABSTRACT

Three-dimensional (3D) memory devices and methods for forming the same are disclosed. The 3D memory device includes a doped semiconductor layer, a source select gate line disposed on the doped semiconductor layer, a stack structure including interleaved conductive layers and dielectric layers formed on the source select gate line, and a channel structure extending through the stack structure and the source select gate line and in contact with the doped semiconductor layer. The channel structure includes a semiconductor channel and a memory film. The source select gate line is in contact with the semiconductor channel.

20 Claims, 32 Drawing Sheets

100

200
118
110
162
104
102
124
112
114
122
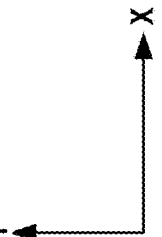
FIG. 4
X
Y

200

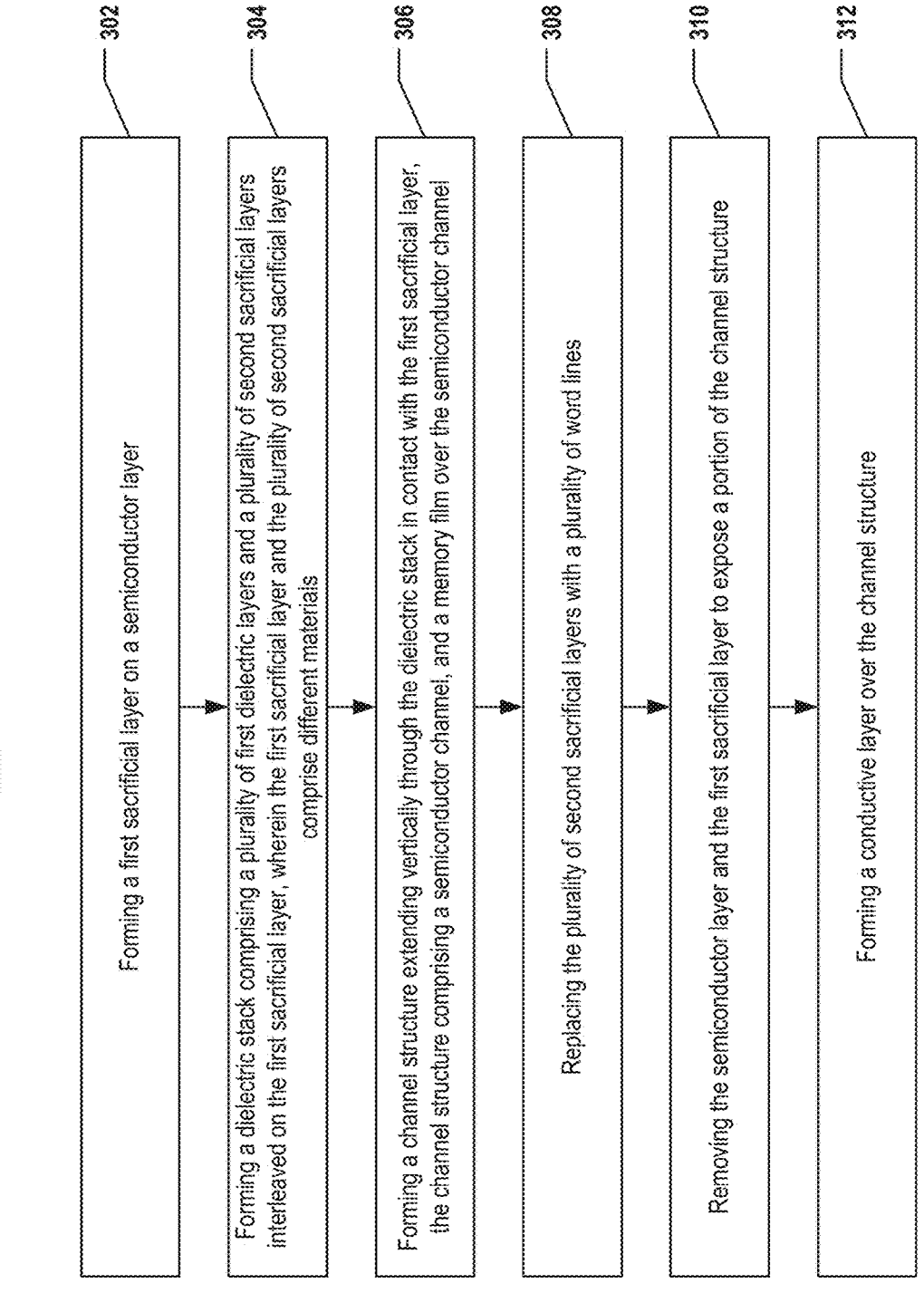

300

302 — Forming a first sacrificial layer on a semiconductor layer

304 — Forming a dielectric stack comprising a plurality of first dielectric layers and a plurality of second sacrificial layers interleaved on the first sacrificial layer, wherein the first sacrificial layer and the plurality of second sacrificial layers comprise different materials 306 — Forming a channel structure extending vertically through the dielectric stack in contact with the first sacrificial layer, the channel structure comprising a semiconductor channel, and a memory film over the semiconductor channel 308 — Replacing the plurality of second sacrificial layers with a plurality of word lines 310 — Removing the semiconductor layer and the first sacrificial layer to expose a portion of the channel structure 312 — Forming a conductive layer over the channel structure

FIG. 8

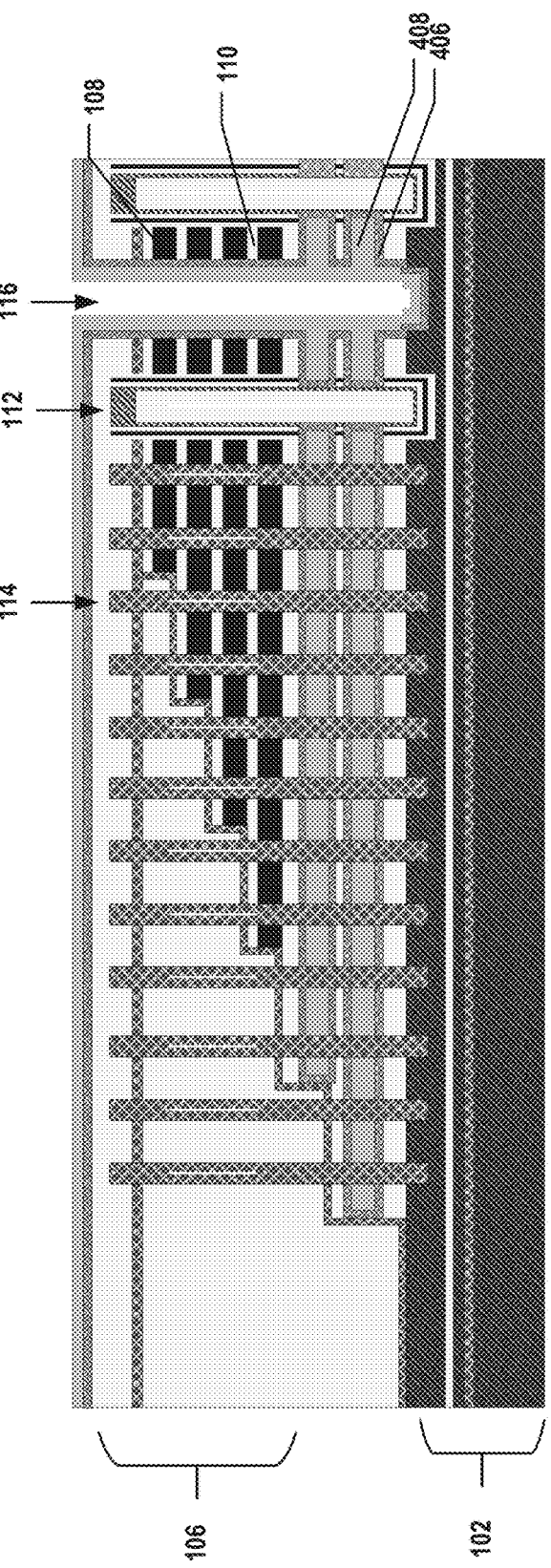
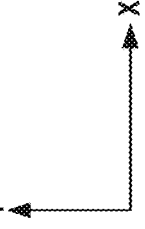
FIG. 14

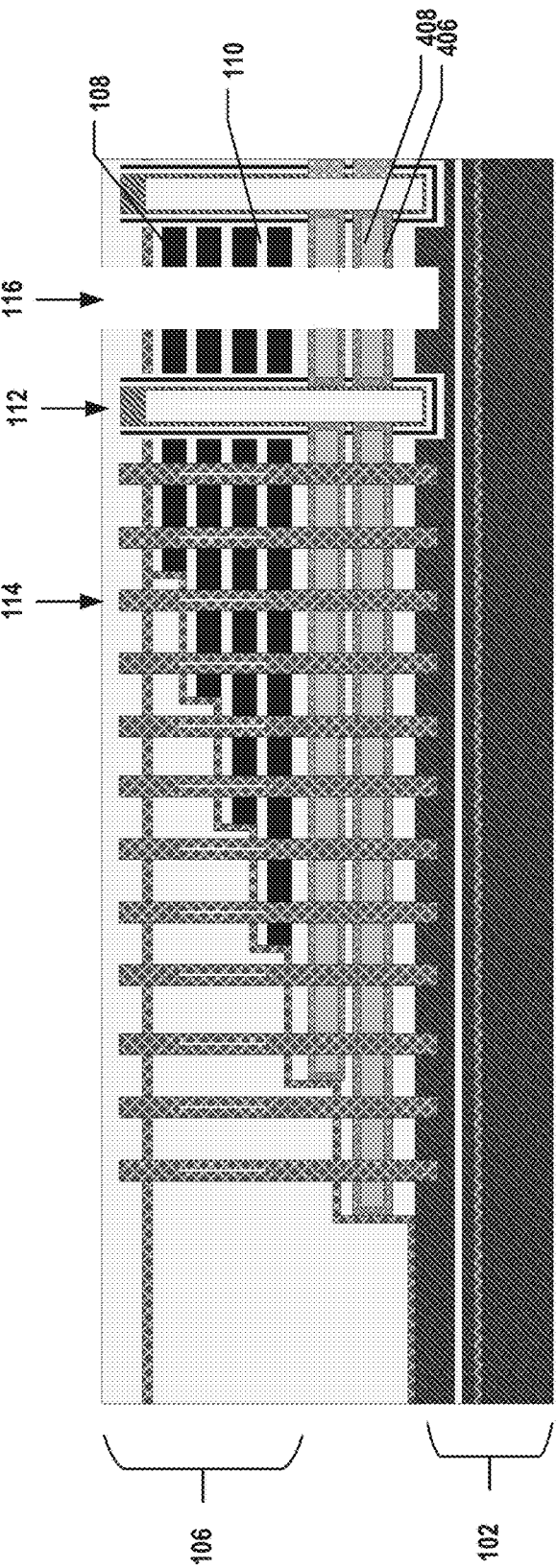
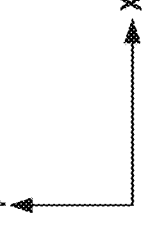
FIG. 15

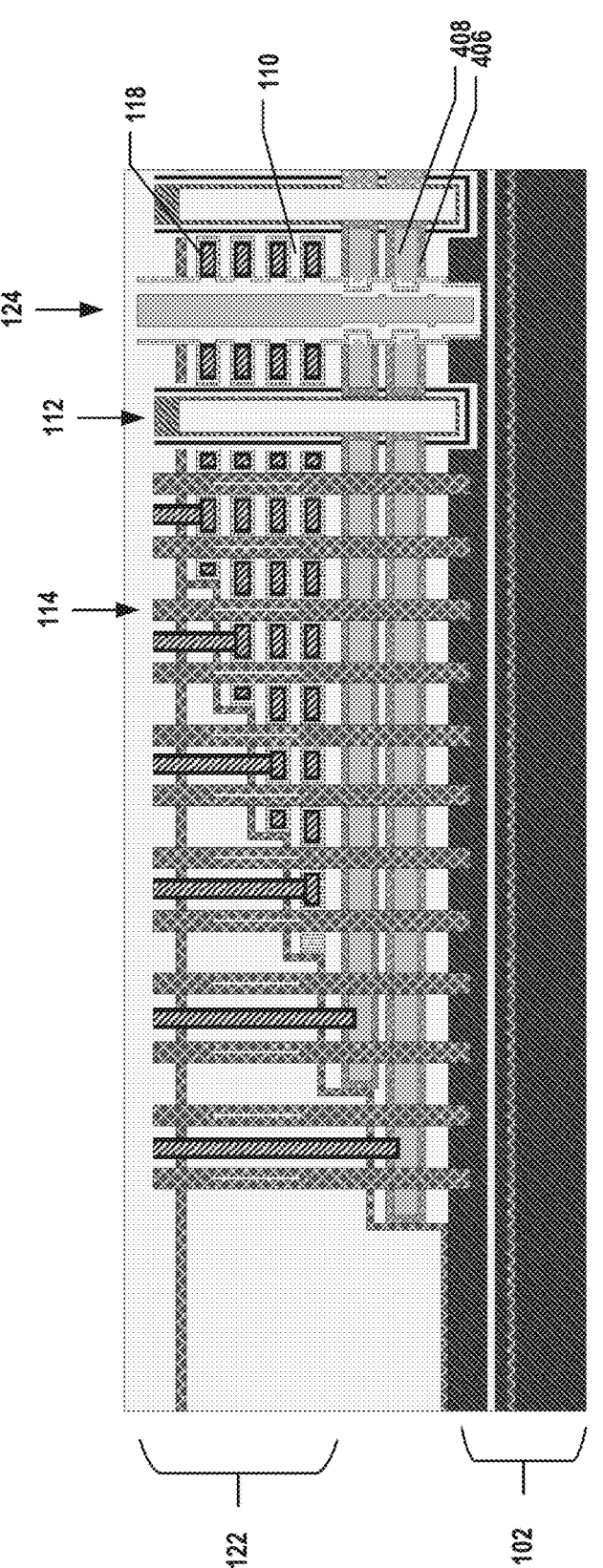
400
118
110
408
406
124
112
114
122
102
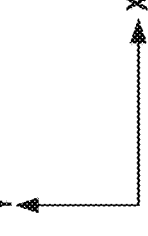
FIG. 17
X
Y

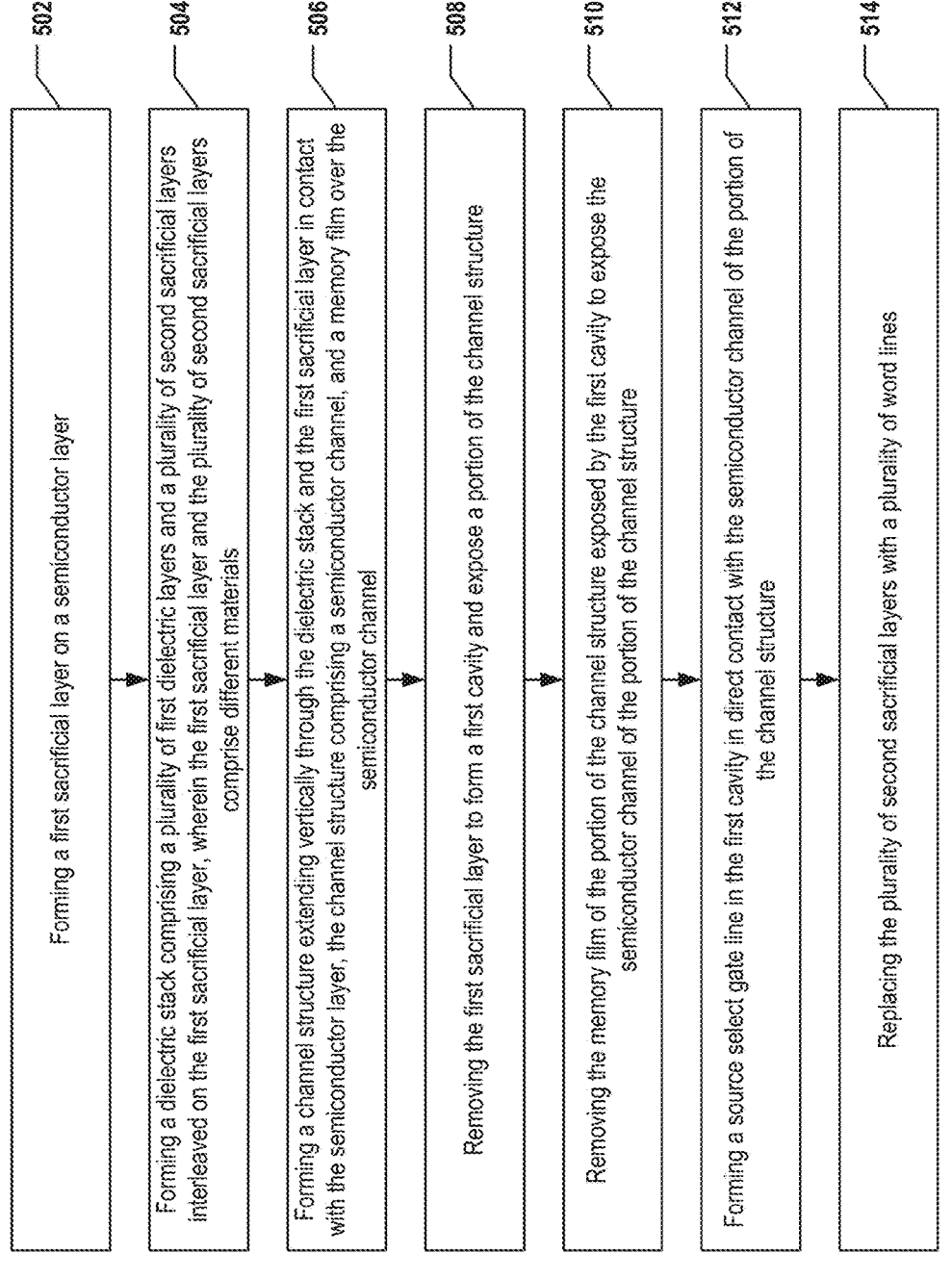

500

502 — Forming a first sacrificial layer on a semiconductor layer

504 — Forming a dielectric stack comprising a plurality of first dielectric layers and a plurality of second sacrificial layers interleaved on the first sacrificial layer, wherein the first sacrificial layer and the plurality of second sacrificial layers comprise different materials 506 — Forming a channel structure extending vertically through the dielectric stack and the first sacrificial layer in contact with the semiconductor layer, the channel structure comprising a semiconductor channel, and a memory film over the semiconductor channel 508 — Removing the first sacrificial layer to form a first cavity and expose a portion of the channel structure 510 — Removing the memory film of the portion of the channel structure exposed by the first cavity to expose the semiconductor channel of the portion of the channel structure 512 — Forming a source select gate line in the first cavity in direct contact with the semiconductor channel of the portion of the channel structure 514 — Replacing the plurality of second sacrificial layers with a plurality of word lines

FIG. 18

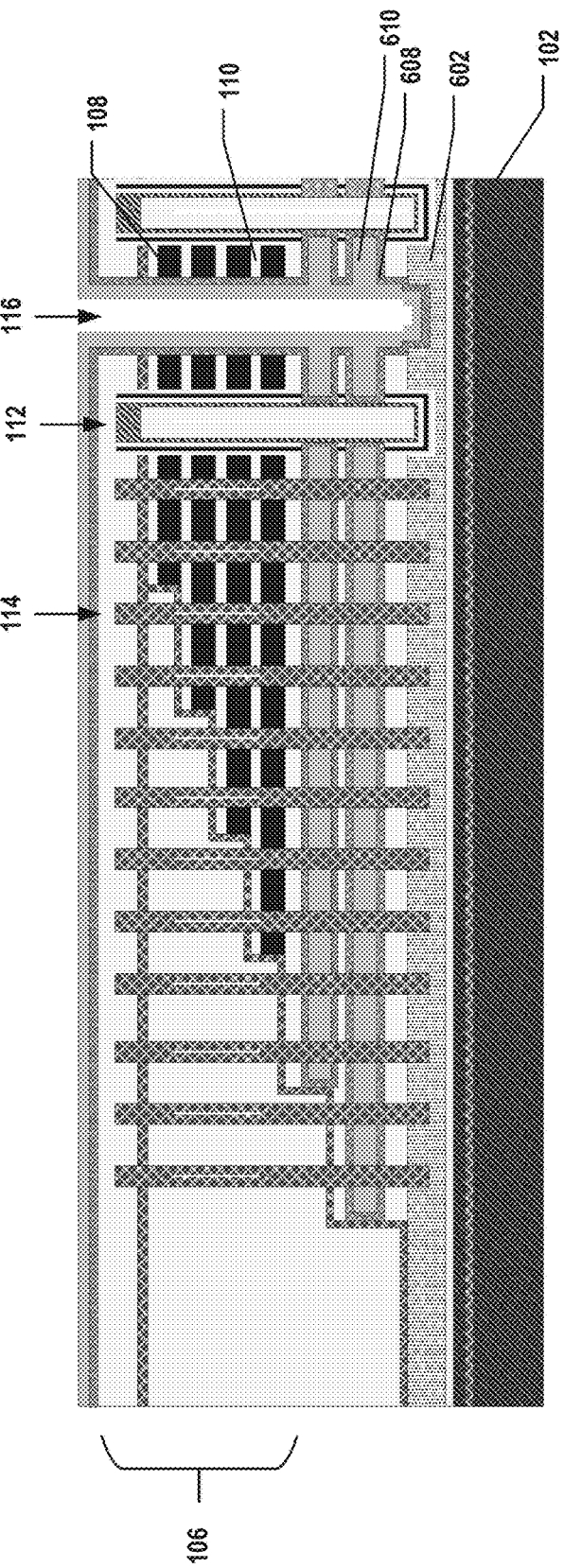
600
106
108
110
610
608
602
102
116
112
114
X
Y
FIG. 24

700

702 — Forming a first sacrificial layer on a semiconductor layer

704 — Forming a second sacrificial layer on the first sacrificial layer, wherein the first sacrificial layer and the second sacrificial layer comprise different materials 706 — Forming a dielectric stack comprising a plurality of first dielectric layers and a plurality of third sacrificial layers interleaved on the second sacrificial layer, wherein the second sacrificial layer and the plurality of third sacrificial layers comprise different materials 708 — Forming a channel structure extending vertically through the dielectric stack and the second sacrificial layer in contact with the first sacrificial layer, the channel structure comprising a semiconductor channel, and a memory film over the semiconductor channel 710 — Removing the second sacrificial layer to form a first cavity and expose a portion of the channel structure 712 — Removing the memory film of the portion of the channel structure exposed by the first cavity to expose the semiconductor channel of the portion of the channel structure 714 — Forming a source select gate line in the first cavity in direct contact with the semiconductor channel of the portion of the channel structure 716 — Replacing the plurality of third sacrificial layers with a plurality of word lines 718 — Removing the semiconductor layer and the first sacrificial layer to expose a portion of the channel structure 720 — Forming a first conductive layer over the channel structure

THREE-DIMENSIONAL MEMORY DEVICES AND METHODS FOR FORMING THE SAME

BACKGROUND

The present disclosure relates to memory devices and methods for forming memory devices, and more particularly, to three-dimensional (3D) memory devices and methods for forming 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

In one aspect, a 3D memory device is disclosed. The 3D memory device includes a doped semiconductor layer, a source select gate line disposed on the doped semiconductor layer, a stack structure including interleaved conductive layers and dielectric layers formed on the source select gate line, and a channel structure extending through the stack structure and the source select gate line and in contact with the doped semiconductor layer. The channel structure includes a semiconductor channel and a memory film. The source select gate line is in contact with the semiconductor channel.

In some implementations, the source select gate line and the conductive layers comprise different materials. In some implementations, the doped semiconductor layer is in contact with the semiconductor channel.

In some implementations, the source select gate line comprises a source select gate dielectric layer and a source select gate conductive layer in contact with the source select gate dielectric layer, and the source select gate dielectric layer is in direct contact with the semiconductor channel. In some implementations, each of the dielectric layer is in direct contact with the memory film.

In another aspect, a 3D memory device is disclosed. The 3D memory device includes a doped semiconductor layer, a source select gate line disposed on the doped semiconductor layer, a stack structure including interleaved word lines and dielectric layers formed on the source select gate line, and a channel structure extending through the stack structure and the source select gate line and in contact with the doped semiconductor layer. The source select gate line includes a source select gate conductive layer surrounded by a source select gate dielectric layer. Each word line includes a gate electrode surrounded by a gate dielectric layer. The channel structure includes a semiconductor channel and a memory film. The source select gate dielectric layer is in contact with the semiconductor channel, and the gate dielectric layer is in contact with the memory film.

In some implementations, the source select gate dielectric layer is between the source select gate conductive layer and the semiconductor channel. In some implementations, the gate dielectric layer and the memory film are between the gate electrode and the semiconductor channel. In some implementations, the source select gate dielectric layer is in direct contact with the semiconductor channel. In some implementations, the source select gate conductive layer includes polysilicon.

In still another aspect, a system is disclosed. The system includes a 3D memory device configured to store data and a memory controller. The 3D memory device includes a doped semiconductor layer, a source select gate line disposed on the doped semiconductor layer, a stack structure including interleaved conductive layers and dielectric layers formed on the source select gate line, and a channel structure extending through the stack structure and the source select gate line and in contact with the doped semiconductor layer. The channel structure includes a semiconductor channel and a memory film. The source select gate line is in contact with the semiconductor channel. The memory controller is coupled to the 3D memory device and is configured to control operations of the channel structure through the source select gate line.

In yet another aspect, a system is disclosed. The system includes a 3D memory device configured to store data and a memory controller. The 3D memory device includes a doped semiconductor layer, a source select gate line disposed on the doped semiconductor layer, a stack structure including interleaved word lines and dielectric layers formed on the source select gate line, and a channel structure extending through the stack structure and the source select gate line and in contact with the doped semiconductor layer. The source select gate line includes a source select gate conductive layer surrounded by a source select gate dielectric layer. Each word line includes a gate electrode surrounded by a gate dielectric layer. The channel structure includes a semiconductor channel and a memory film. The source select gate dielectric layer is in contact with the semiconductor channel, and the gate dielectric layer is in contact with the memory film. The memory controller is coupled to the 3D memory device and is configured to control operations of the channel structure through the source select gate line.

In yet another aspect, a method for forming a 3D memory device is disclosed. A first sacrificial layer is formed on a semiconductor layer. A dielectric stack including a plurality of first dielectric layers and a plurality of second dielectric layers is formed interleaved on the first sacrificial layer. The first sacrificial layer and the plurality of second dielectric layers include different materials. A channel structure is formed extending through the dielectric stack in contact with the first sacrificial layer. The channel structure includes a semiconductor channel and a memory film. The plurality of second dielectric layers are replaced with a plurality of word lines. The semiconductor layer and the first sacrificial layer are removed to expose a portion of the channel structure. A doped semiconductor layer is formed on the channel structure.

In some implementations, the first sacrificial layer has a high etch selectivity comparing to the first dielectric layers and the second dielectric layers. In some implementations, the first sacrificial layer comprises high dielectric constant (high-k) material. In some implementations, the first sacrificial layer comprises tungsten.

In some implementations, the channel structure and a dummy channel structure are formed extending vertically through the dielectric stack in contact with the first sacrificial layer. In some implementations, an opening is formed extending vertically through the dielectric stack to expose the first sacrificial layer. The plurality of second dielectric layers are removed through the opening to form a plurality of first cavities. The plurality of word lines are formed in the plurality of first cavities. A slit structure is formed in the opening.

In some implementations, the semiconductor layer is removed until being stopped by the first sacrificial layer. The first sacrificial layer and a portion of the memory film of the channel structure are removed to expose a portion of the semiconductor channel of the channel structure.

In some implementations, the doped semiconductor layer is formed on the portion of the semiconductor channel of the channel structure. The doped semiconductor layer is activated. In some implementations, an interconnection structure is formed on the doped semiconductor layer.

In yet another aspect, a method for forming a 3D memory device is disclosed. A first sacrificial layer is formed on a semiconductor layer. A dielectric stack including a plurality of first dielectric layers and a plurality of second dielectric layers is formed interleaved on the first sacrificial layer. The first sacrificial layer and the plurality of second dielectric layers include different materials. A channel structure is formed extending through the dielectric stack and the first sacrificial layer in contact with the semiconductor layer. The channel structure includes a semiconductor channel and a memory film. The first sacrificial layer is removed to form a first cavity and expose a portion of the channel structure. The memory film of the portion of the channel structure exposed by the first cavity is removed to expose the semiconductor channel of the portion of the channel structure. A source select gate line is formed in the first cavity in contact with the semiconductor channel of the portion of the channel structure. The plurality of second dielectric layers are replaced with a plurality of word lines.

In some implementations, an opening is formed extending through the dielectric stack and the first sacrificial layer to expose the semiconductor layer. The first sacrificial layer is removed through the opening to form the first cavity and expose the portion of the channel structure.

In some implementations, the memory film of the portion of the channel structure are removed through the opening and the first cavity to expose the semiconductor channel of the portion of the channel structure.

In some implementations, a third dielectric layer is formed on sidewalls of the opening and the first cavity. A first conductive layer is formed on the third dielectric layer. The first conductive layer and the third dielectric layer on sidewalls of the opening are removed.

In some implementations, the third dielectric layer is in contact with the semiconductor channel of the portion of the channel structure.

In some implementations, a fourth dielectric layer is formed on the first conductive layer exposed by the opening. The plurality of second dielectric layers are removed to form a plurality of second cavities. The plurality of word lines are formed in the plurality of second cavities. A slit structure is formed in the opening.

In some implementations, a second sacrificial layer is formed on the first sacrificial layer. The first sacrificial layer and the second sacrificial layer include different materials. In some implementations, the second sacrificial layer and the plurality of second dielectric layers include different materials.

In some implementations, the channel structure extends through the dielectric stack and the second sacrificial layer in contact with the first sacrificial layer.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 2-7 illustrate a fabrication process for forming an exemplary 3D memory device, according to some aspects of the present disclosure.

FIG. 8 illustrates a flowchart of an exemplary method for forming a 3D memory device, according to some aspects of the present disclosure.

FIGS. 9-17 illustrate a fabrication process for forming another exemplary 3D memory device, according to some aspects of the present disclosure.

FIG. 18 illustrates a flowchart of another exemplary method for forming a 3D memory device, according to some aspects of the present disclosure.

FIGS. 19-30 illustrate a fabrication process for forming still another exemplary 3D memory device, according to some aspects of the present disclosure.

FIG. 31 illustrates a flowchart of still another exemplary method for forming a 3D memory device, according to some aspects of the present disclosure.

Figure 1:
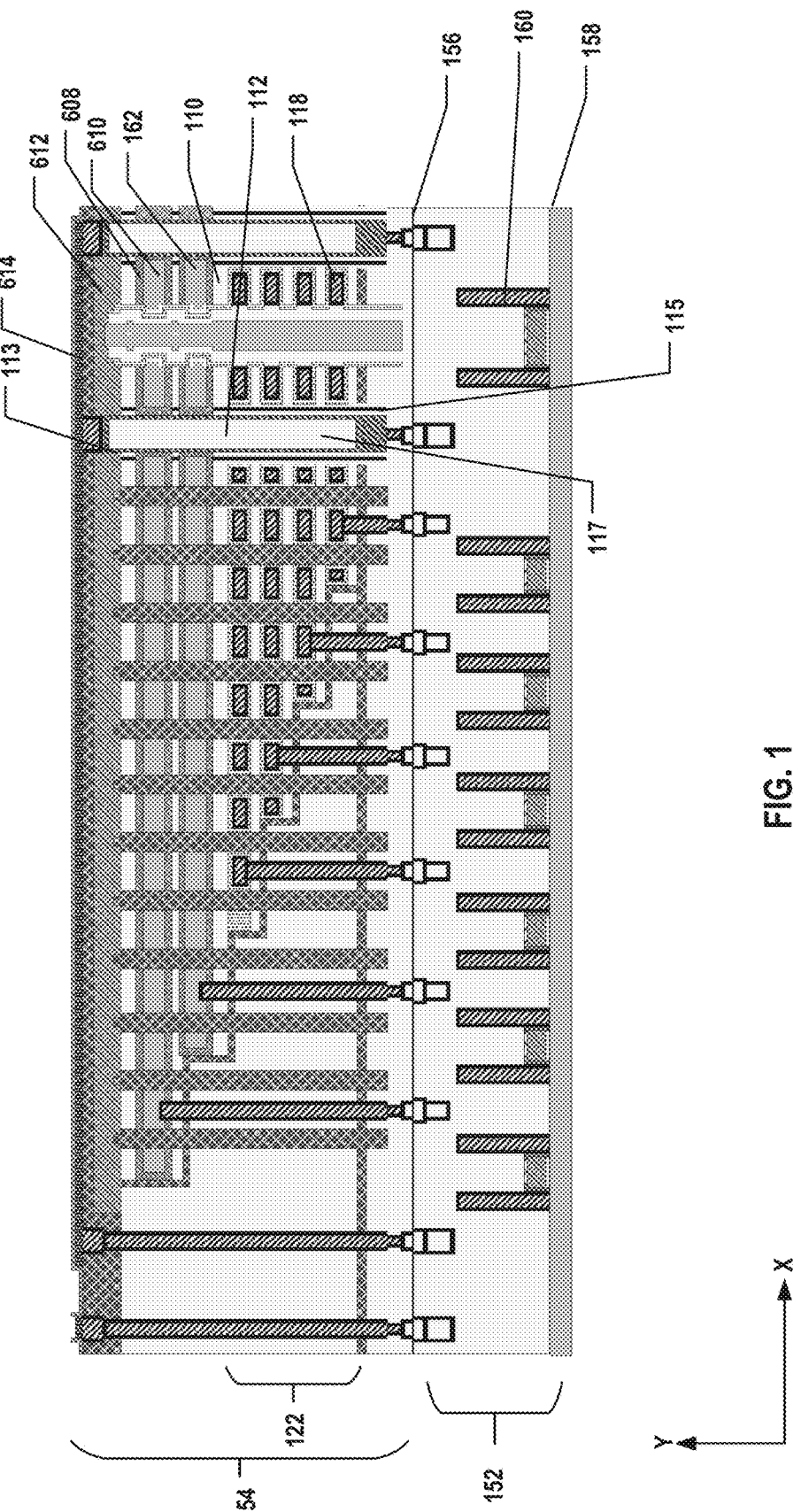
FIG. 1 illustrates a side view of a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a stack of gate electrodes may be arranged over a substrate, with a plurality of semiconductor channels through and intersecting word lines, into the implanted substrate. The bottom/lower gate electrode or electrodes function as source select gate lines, which are also called bottom select gates (BSG) in some cases. The top/upper gate electrode or electrodes function as drain select gate lines, which are also called top select gates (TSG) in some cases. The gate electrodes between the top/upper select gate electrodes and the bottom/lower gate electrodes function as word lines (WLs). The intersection of a word line and a semiconductor channel forms a memory cell.

With the development of artificial intelligence (AI), big data, Internet of Things (IoT), mobile communication, mobile equipment and cloud storage, the NAND memory has gradually become a mainstream semiconductor memory. The conventional two-dimensional (2D) NAND memory has reached its limitation and therefore the 3D NAND memory developed in the longitudinal direction has been developed. However, how to increase the storage capacity of the 3D NAND memory within the same semiconductor size is a problem that needs to be solved. The current practice is to increase the effective storage layers and the number of insulating layers in the longitudinal direction. The challenge is the difficulties of fabricating the staircase, the channel hole, the gate line slit, or even the oxide-nitride-oxide deposition in the increased layers.

Another challenge is the source select gate line structure. When the source select gate line contacts the channel structure with the oxide-nitride-oxide structures, the electric charge may be trimmed or erased frequently, and the reliability and durability of the 3D NAND memory will be affected.

To address one or more of the aforementioned issues, the present disclosure introduces a solution in which the source select gate line may be formed like the complementary metal-oxide-semiconductor (CMOS) structure to avoid the trimming operation. Moreover, consistent with the scope of the present disclosure, a sacrificial layer is formed under the effective storage layers, and when forming the channel hole, the gate line slit, or the contact, the sacrificial layer could be a etch stop layer to precisely control the etch process.

FIG. 1 illustrates a side view of a cross-section of an exemplary 3D memory device 100, according to some aspects of the present disclosure. In some implementations, 3D memory device 100 is a bonded chip including a first semiconductor structure 152 and a second semiconductor structure 154 stacked over first semiconductor structure 152. First and second semiconductor structures 152 and 154 are jointed at a bonding interface 156 therebetween, according to some implementations.

As shown in FIG. 1, first semiconductor structure 152 can include a substrate 158, which can include silicon (e.g., single crystalline silicon, c-Si), silicon germanium (SiGe), gallium arsenide (GaAs), germanium (Ge), silicon-on-insulator (SOI), or any other suitable materials. First semiconductor structure 152 of 3D memory device 100 may include peripheral circuits 160 on substrate 158.

It is noted that x and y axes are included in FIG. 1 to further illustrate the spatial relationship of the components in 3D memory device 100. Substrate 158 includes two lateral surfaces (e.g., a top surface and a bottom surface) extending laterally in the x-direction (i.e., the lateral direction). As used herein, whether one component (e.g., a layer or a device) is on, above, or below another component (e.g., a layer or a device) of a semiconductor device (e.g., 3D memory device 100) is determined relative to the substrate of the semiconductor device (e.g., substrate 158) in the y-direction (i.e., the vertical direction) when the substrate is positioned in the lowest plane of the semiconductor device in they-direction. The same notion for describing spatial relationships is applied throughout the present disclosure.

In some implementations, peripheral circuit 160 is configured to control and sense 3D memory device 100. Peripheral circuit 160 may be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuit 160 may include transistors formed on substrate 158, in which the entirety or part of the transistors are formed in substrate 158 (e.g., below the top surface of substrate 158) and/or directly on substrate 158. Isolation regions (e.g., shallow trench isolations (STIs)) and doped regions (e.g., source regions and drain regions of the transistors) can be formed in substrate 158 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral circuit 160 may further include any other circuits compatible with the advanced logic processes including logic circuits, such as processors and programmable logic devices (PLDs), or memory circuits, such as static random-access memory (SRAM) and dynamic RAM (DRAM).

In some implementations, first semiconductor structure 152 of 3D memory device 100 further includes an interconnect layer (not shown) above peripheral circuits 160 to transfer electrical signals to and from peripheral circuits 160. The interconnect layer can include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-of-line (BEOL) interconnects. The interconnect layer can further include one or more interlayer dielectric (TLD) layers (a.k.a. intermetal dielectric (ID) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

Second semiconductor structure 154 may be bonded on top of first semiconductor structure 152 in a face-to-face manner at bonding interface 156. In some implementations, bonding interface 156 is disposed as a result of hybrid bonding (also known as "metal/dielectric hybrid bonding"), which is a direct bonding technology (e.g., forming bonding between surfaces without using intermediate layers, such as solder or adhesives) and may obtain metal-metal bonding and dielectric-dielectric bonding simultaneously.

In some implementations, second semiconductor structure 154 of 3D memory device 100 further includes an interconnect layer (not shown) above bonding interface 156 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some implementations, 3D memory device 100 is a NAND Flash memory device in which memory cells are provided in the form of an array of NAND memory strings. Each NAND memory string can include a respective channel structure 112. As shown in FIG. 1, each channel structure 112 may extend vertically through a plurality of pairs including interleaved conductive layers 118 and first dielectric layers 110. The interleaved conductive layers 118 and first dielectric layers 110 are part of a memory stack 122. The number of the pairs of conductive layers 118 and first dielectric layers 110 in memory stack 122 determines the number of memory cells in 3D memory device 100. It is understood that in some implementations, memory stack 122 may have a multi-deck architecture (not shown), which includes a plurality of memory decks stacked over one another. The numbers of the pairs of conductive layers 118 and first dielectric layers 110 in each memory deck can be the same or different.

Memory stack 122 can include a plurality of interleaved conductive layers 118 and first dielectric layers 110. Conductive layers 118 and first dielectric layers 110 in memory stack 122 may alternate in the vertical direction. In other words, except the ones at the top or bottom of memory stack 122, each conductive layer 118 can be adjoined by two first dielectric layers 110 on both sides, and each first dielectric layer 110 can be adjoined by two conductive layers 118 on both sides. Conductive layers 118 can include conductive materials including, but not limited to, W, Co, Cu, Al, polysilicon, doped silicon, silicides, or any combination thereof. Each conductive layer 118 can include a gate electrode (gate line) surrounded by an adhesive layer and a gate dielectric layer. The gate electrode of conductive layer 118 can extend laterally as a word line, ending at one or more staircase structures of memory stack 122. First dielectric layers 110 can include dielectric materials including, but not limited to, silicon oxide, silicon nitride, silicon oxynitride, or any combination thereof.

In some implementations, each channel structure 112 includes a channel hole filled with a semiconductor channel 113 and a composite dielectric film 115 (also referred to herein as "memory film 115"). As shown in FIG. 1, the remaining space of the channel hole can be partially filled with a capping layer 117 including dielectric materials, such as silicon oxide, and/or an air gap. Channel structure 112 can have a cylinder shape (e.g., a pillar shape). Capping layer 117, semiconductor channel 113, and composite dielectric film 115 are arranged radially from the center toward the outer surface of the pillar in this order, according to some implementations. Composite dielectric film 115 can radially circumscribe semiconductor channel 113 along the lateral direction (e.g., the x-direction in FIG. 1). Composite dielectric film 115 can be formed laterally between semiconductor channel 113 and memory stack 122.

In some implementations, channel structure 112 may further extend vertically through one or more than one source select gate line 162, which may also be called a bottom select gate (BSG) line in some cases. In some implementations, source select gate line 162 may be formed by a source select gate dielectric layer 608 and a source select gate conductive layer 610. In some implementations, an adhesive layer (not shown) may be further formed between source select gate dielectric layer 608 and source select gate conductive layer 610.

In some implementations, source select gate conductive layer 610 may be made from tungsten, the adhesion layer may include titanium/titanium nitride (Ti/TiN) or tantalum/tantalum nitride (Ta/TaN), and source select gate dielectric layer 608 may be made from high-k dielectric materials. As shown in FIG. 1, source select gate dielectric layer 608 directly contacts channel structure 112. Specifically, source select gate dielectric layer 608 directly contacts semiconductor channel 113 of channel structure 112. The adhesion layer may locate inside and in contact with source select gate dielectric layer 608, and source select gate conductive layer 610 locates inside and in contact with the adhesion layer. In some implementations, source select gate line 162 may include source select gate conductive layer 610, the adhesion layer, and source select gate dielectric layer 608.

In some implementations, source select gate conductive layer 610 may include polysilicon material. In the situation that source select gate conductive layer 610 is formed by the same material, e.g., W, with word lines (conductive layers 118), the threshold voltage (Vt) of the BSG transistor may have a shift in some working modes or under some voltage arrangements. For example, if a high voltage applied to the NAND memory string or the memory device is operated at a high temperature during the program/erase cycling, the threshold voltage (Vt) of the BSG transistor may have a shift. By forming the source select gate line like the CMOS structure, the induced threshold voltage (Vt) shift of BSG transistor can be improved.

In some implementations, source select gate conductive layer 610 may be formed by other suitable conductive materials. In some implementations, source select gate dielectric layer 608 may be formed by high dielectric constant (high-k) materials.

As shown in FIG. 1, second semiconductor structure 154 of 3D memory device 100 can also include a doped semiconductor layer 612 above memory stack 122. In some implementations, semiconductor channel 113 of channel structure 112 may be in contact with doped semiconductor layer 612. In some implementations, doped semiconductor layer 612 may include polysilicon, high-k dielectric, or a metal. For example, a high-k dielectric may include any dielectric materials having a dielectric constant (k) higher than that of silicon oxide (e.g., k>3.7).

Each channel structure 112 may extend vertically through interleaved conductive layers 118 and first dielectric layers 110 of memory stack 122, and source select gate line 162, and in contact with doped semiconductor layer 612. In some implementations, semiconductor channel 113 at the source end of channel structure 112 may be exposed and in direct contact with doped semiconductor layer 612.

In some implementations, an interconnection structure 614 may be formed on doped semiconductor layer 612. The source end of channel structure 112 may be coupled to interconnection structure 614 through a source contact.

FIGS. 2-7 illustrate a fabrication process for forming an exemplary 3D memory device 200, according to some aspects of the present disclosure. FIG. 8 illustrates a flowchart of an exemplary method 300 for forming 3D memory device 200, according to some aspects of the present disclosure. For the purpose of better describing the present disclosure, the cross-sections of 3D memory device 200 in FIGS. 2-7 and method 300 in FIG. 8 will be discussed together. It is understood that the operations shown in method 300 are not exhaustive and that other operations may be performed as well before, after, or between any of the illustrated operations. Further, some of the operations may be performed simultaneously, or in a different order than shown in FIGS. 2-7 and FIG. 8.

Figure 2:
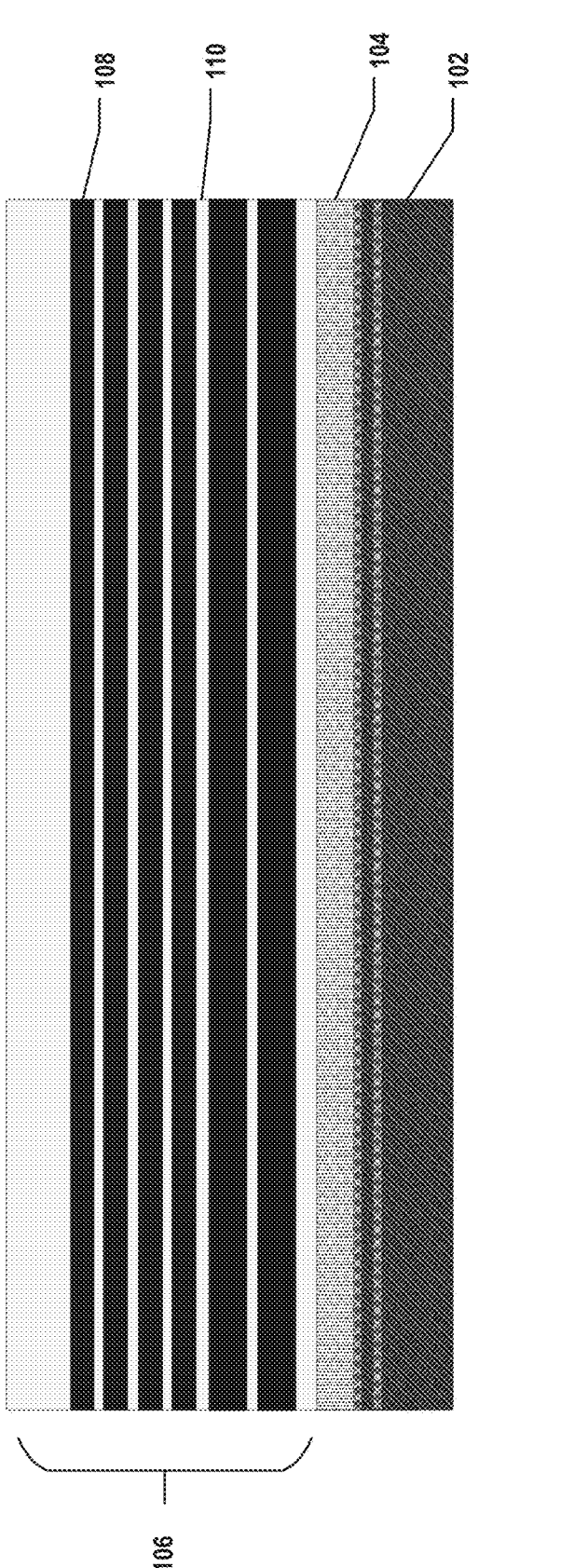

As shown in FIG. 2 and operation 302 of FIG. 8, a first sacrificial layer 104 is formed on a semiconductor layer 102. In some implementations, semiconductor layer 102 may be a carrier substrate. In some implementations, the carrier substrate may be a doped semiconductor layer. In some implementations, a pad oxide layer may be formed between semiconductor layer 102 and first sacrificial layer 104 by depositing dielectric materials, such as silicon oxide, on semiconductor layer 102.

In some implementations, first sacrificial layer 104 may include polysilicon, high-k dielectric, or metal. In some implementations, first sacrificial layer 104 may include tungsten. First sacrificial layer 104 may act as an etch stop layer when forming the channel structure, the dummy channel structure, the gate line slit structure, and/or the contact structure in a later operation.

Then, as shown in FIG. 2 and operation 304 of FIG. 8, a dielectric stack 106 including interleaved first dielectric layers 110 and second dielectric layers 108 is formed on first sacrificial layer 104. First sacrificial layer 104 and second dielectric layers 108 are formed by different materials. The dielectric stack 106 includes interleaved first dielectric layers 110 and second dielectric layers 108 extending in the x-direction. In some implementations, each first dielectric layer 110 may include silicon oxide, and each second dielectric layer 108 may include silicon nitride. Dielectric stack 106 may be formed by one or more thin film deposition processes including, but not limited to, chemical vapor deposition (CVD), physical vapor deposition (PVD), atomic layer deposition (ALD), or any combination thereof.

Figure 3:
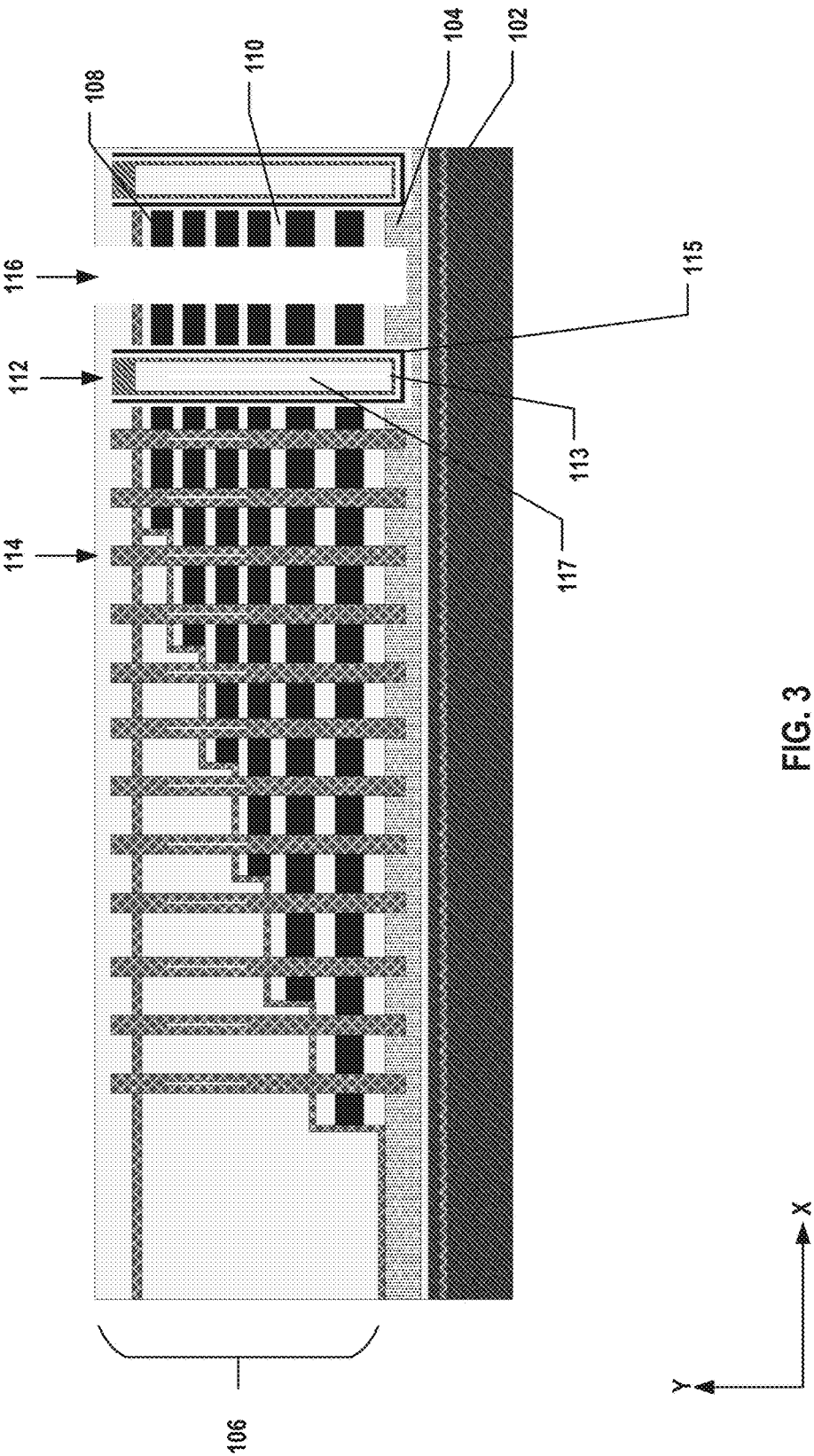

As shown in FIG. 3 and operation 306 of FIG. 8, channel structure 112 is formed extending vertically through dielectric stack 106 in contact with first sacrificial layer 104. Channel structure 112 includes semiconductor channel 113 and memory film 115.

As illustrated in FIG. 3, a staircase structure is formed on the edge of dielectric stack 106. The staircase structure may be formed by performing a plurality of so-called "trim-etch" cycles to the dielectric layer pairs of dielectric stack 106. Due to the repeated trim-etch cycles applied to the dielectric layer pairs of dielectric stack 106, dielectric stack 106 can have one or more tilted edges and a top dielectric layer pair shorter than the bottom one, as shown in FIG. 3.

Channel structure 112 is formed extending vertically through dielectric stack 106 in contact with first sacrificial layer 104. Channel structure 112 includes semiconductor channel 113, and memory film 115, including a third dielectric layer, a fourth dielectric layer, and a fifth dielectric layer, over semiconductor channel 113. Here, "over" not only means the meaning of above something but can also include the meaning it is laterally on something with no intermediate feature or layer therebetween. In some implementations, to form channel structure 112, a channel hole extending through dielectric stack 106 is formed, stopping at first sacrificial layer 104.

The third dielectric layer, the fourth dielectric layer, the fifth dielectric layer, and semiconductor channel 113 are sequentially formed in the channel hole. In some implementations, the fourth dielectric layer includes a dielectric material different from the third and fifth dielectric layers. For example, the fourth dielectric layer may include silicon nitride, and the third and fifth dielectric layers may include silicon oxide.

Each channel hole is an opening extending vertically through and beyond dielectric stack 106, stopping at first sacrificial layer 104. In some implementations, a plurality of openings are formed, such that each opening becomes the location for growing an individual channel structure 112 in the later process. In some implementations, fabrication processes for forming the channel holes of channel structures 112 include wet etching and/or dry etching, such as deep RIE (DRIE). The etching of the channel holes continues until being stopped by first sacrificial layer 104, such as silicon oxide or polysilicon, according to some implementations. In some implementations, the etching conditions, such as etching rate and time, can be controlled to ensure that each channel hole has reached and stopped by first sacrificial layer 104 to minimize the gouging variations among the channel holes and channel structures 112 formed therein. It is understood that depending on the specific etching selectivity, one or more channel holes may extend into first sacrificial layer 104 to a small extent, which is still viewed as being stopped by first sacrificial layer 104 in the present disclosure.

Memory film 115 (the third dielectric layer, the fourth dielectric layer, and the fifth dielectric layer), and semiconductor channel 113 are sequentially formed in this order along sidewalls and the bottom surface of the channel hole. In some implementations, memory film 115 is first deposited along the sidewalls and bottom surface of the channel hole using one or more thin film deposition processes, such as ALD, CVD, PVD, any other suitable processes, or any combination thereof. Semiconductor channel 113 then may be formed by depositing a semiconductor material, such as polysilicon (e.g., undoped polysilicon), over memory film 115 using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "ONOP" structure) are sequentially deposited to form memory film 115 and semiconductor channel 113.

Capping layer 117 may be formed in the channel hole and over semiconductor channel 113 to fully or partially fill the channel hole (e.g., without or with an air gap). Capping layer 117 can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some implementations, one or more than one dummy channel structure 114 may also be formed extending vertically through dielectric stack 106 in contact with first sacrificial layer 104.

As illustrated in FIG. 3, an opening 116 may be formed extending vertically through dielectric stack 106 and expose first sacrificial layer 104. In some implementations, fabrication processes for forming opening 116 include wet etching and/or dry etching, such as DRIE. A gate replacement then can be performed through opening 116 to replace second dielectric layers 108 with word lines in a later operation.

As shown in FIG. 4 and operation 308 of FIG. 8, the plurality of second dielectric layers 108 are replaced with a plurality of word lines. In some implementations, a plurality of cavities may be first formed by removing second dielectric layers 108 through opening 116. In some implementations, second dielectric layers 108 are removed by applying etchants through opening 116, creating cavities interleaved between first dielectric layers 110. The etchants can include any suitable etchants that etch second dielectric layers 108 selective to first dielectric layers 110. Furthermore, the etchants can include any suitable etchants that etch second dielectric layers 108 selective to first sacrificial layer 104.

Then, the word lines (including conductive layers 118 and adhesive layers) are deposited into the cavities through opening 116. In some implementations, a gate dielectric layer is deposited into the cavities prior to conductive layers 118, such that conductive layers 118 are deposited on the gate dielectric layer. Conductive layers 118, such as metal layers, can be deposited using one or more thin film deposition processes, such as ALD, CVD, PVD, any other suitable processes, or any combination thereof. In some implementations, the gate dielectric layer, such as a high-k dielectric layer, is formed along the sidewall and at the bottom of opening 116 as well. Memory stack 122 including interleaved conductive layers 118 and first dielectric layers 110 is thereby formed, replacing dielectric stack 106, according to some implementations.

In some implementations, one or more than one source select gate line 162 may be formed between memory stack 122 and first sacrificial layer 104. In some implementations, source select gate line 162 may have the same structure as conductive layers 118 and may be formed in the same processes. In some implementations, source select gate line 162 and conductive layers 118 may have different structures.

A slit structure 124 extending vertically through memory stack 122 is formed, stopping on first sacrificial layer 104. Slit structure 124 may be formed by depositing one or more dielectric materials, such as silicon oxide, into opening 116 to fully or partially fill opening 116 (with or without an air gap) using one or more thin film deposition processes, such as ALD, CVD, PVD, any other suitable processes, or any combination thereof. In some implementations, slit structure 124 includes the gate dielectric layer (e.g., including high-k dielectrics) and a dielectric capping layer (e.g., including silicon oxide). In some implementations, the dielectric capping layer may partially fill opening 116, and a polysilicon core layer may fill the remaining space of opening 116 as part of slit structure 124 to adjust the mechanical properties, such as hardness or stress, of slit structure 124. After the formation of slit structure 124, local contacts, including channel local contacts, word line local contacts, and peripheral contacts may be formed. A bonding layer may be formed above channel local contacts, word line local contacts, and peripheral contacts.

Figure 5:
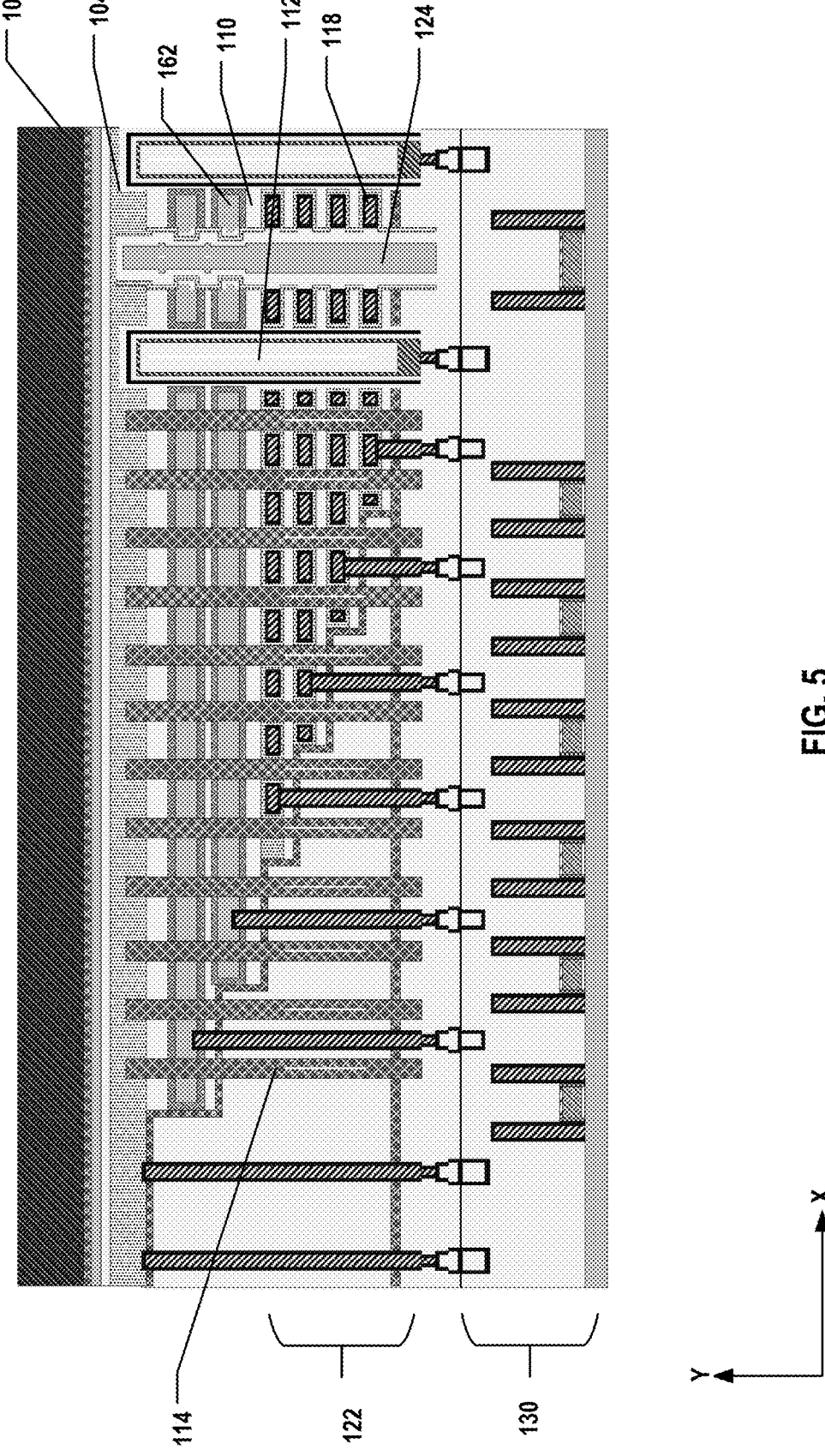

As shown in FIG. 5, a wafer bonding operation may be performed, such that memory stack 122 is above a peripheral circuit structure 130. The bonding can include hybrid bonding. In some implementations, semiconductor layer 102 and components formed thereon (e.g., memory stack 122 and channel structures 112 formed therethrough) are flipped upside down. After the bonding, memory stack 122 and channel structures 112 formed therethrough can be electrically connected to the peripheral circuits in peripheral circuit structure 130 and are above peripheral circuit structure 130.

Figure 6:
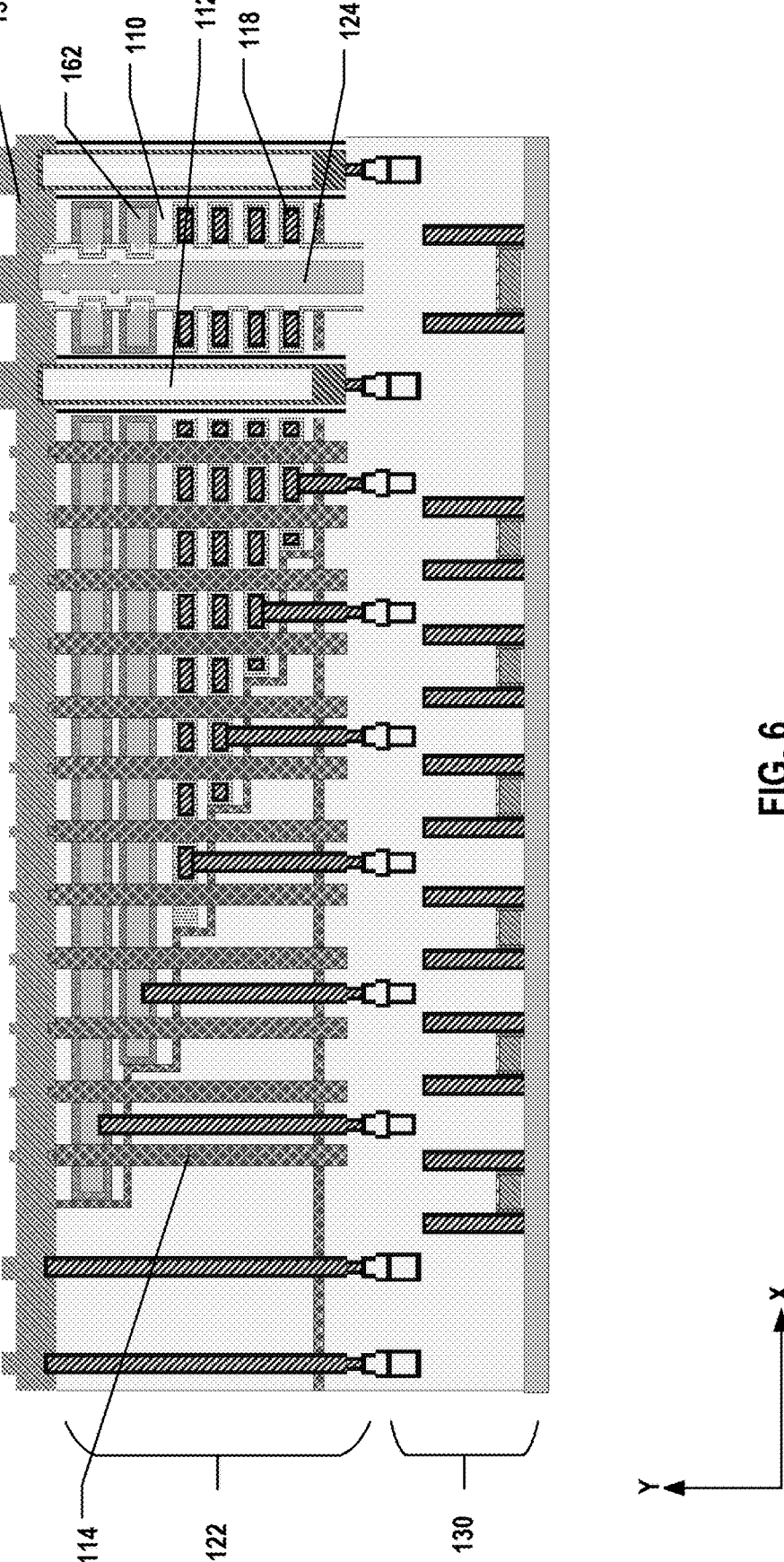

As shown in FIG. 6 and operation 310 in FIG. 8, semiconductor layer 102 and first sacrificial layer 104 are removed to expose a portion of channel structure 112. In some implementations, the removal may be performed from the backside of semiconductor layer 102. In some implementations, semiconductor layer 102 (the carrier substrate) may be first removed, stopping at first sacrificial layer 104. In some implementations, semiconductor layer 102 may be completely removed using chemical-mechanical polishing (CMP), grinding, dry etching, and/or wet etching. In some implementations, semiconductor layer 102 may be peeled off.

Then, first sacrificial layer 104 may be completely removed as well using wet etching with suitable etchants, such as phosphoric acid and hydrofluoric acid. In some implementations, part of channel structure 112 extending into first sacrificial layer 104 is removed, such that semiconductor channel 113 at the upper end (the source end) of channel structure 112 is exposed.

As shown in FIG. 6 and operation 312 in FIG. 8, a conductive layer is formed over channel structure 112. A doped semiconductor layer 132 is formed on memory stack 122 covering the exposed semiconductor channel 113. In some implementations, to form doped semiconductor layer 132, a semiconductor layer (e.g., polysilicon) may be deposited on memory stack 122 in contact with the exposed semiconductor channel 113 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 132, in-situ doping of N-type dopants, such as P, As, or Sb, is performed when depositing the semiconductor layer on memory stack 122 covering the exposed semiconductor channel 113. In some implementations, a CMP process may be further performed to remove any excess doped semiconductor layer 132 as needed.

In some implementations, doped semiconductor layer 132 and the part of semiconductor channel 113 that is in contact with doped semiconductor layer 132 are locally activated. In some implementations, to locally activate, heat is applied in a confined area having doped semiconductor layer 132 and the part of semiconductor channel 113 to activate dopants in doped semiconductor layer 132 and the part of semiconductor channel 113. The confined area can be between the stack structure and doped semiconductor layer 132. In some implementations, the doping concentration of doped semiconductor layer 132 and the doping concentration of the part of semiconductor channel 113 in contact with doped semiconductor layer 132 each is between $10^{19}$ cm$^{-3}$ and $10^{21}$ cm$^{-3}$ after the activation.

The local activation process can activate the dopants such that the dopants can occupy the silicon lattices to reduce the contact resistance between doped semiconductor layer 132 and semiconductor channel 113 as well as to reduce the sheet resistance of doped semiconductor layer 132. On the other hand, by confining the heat during the local activation process into an area without heat-sensitive structures, any potential damages to the heat-sensitive structures, such as the bonding interface and Cu interconnects used for connecting the peripheral circuits, can be reduced or avoided.

Figure 7:
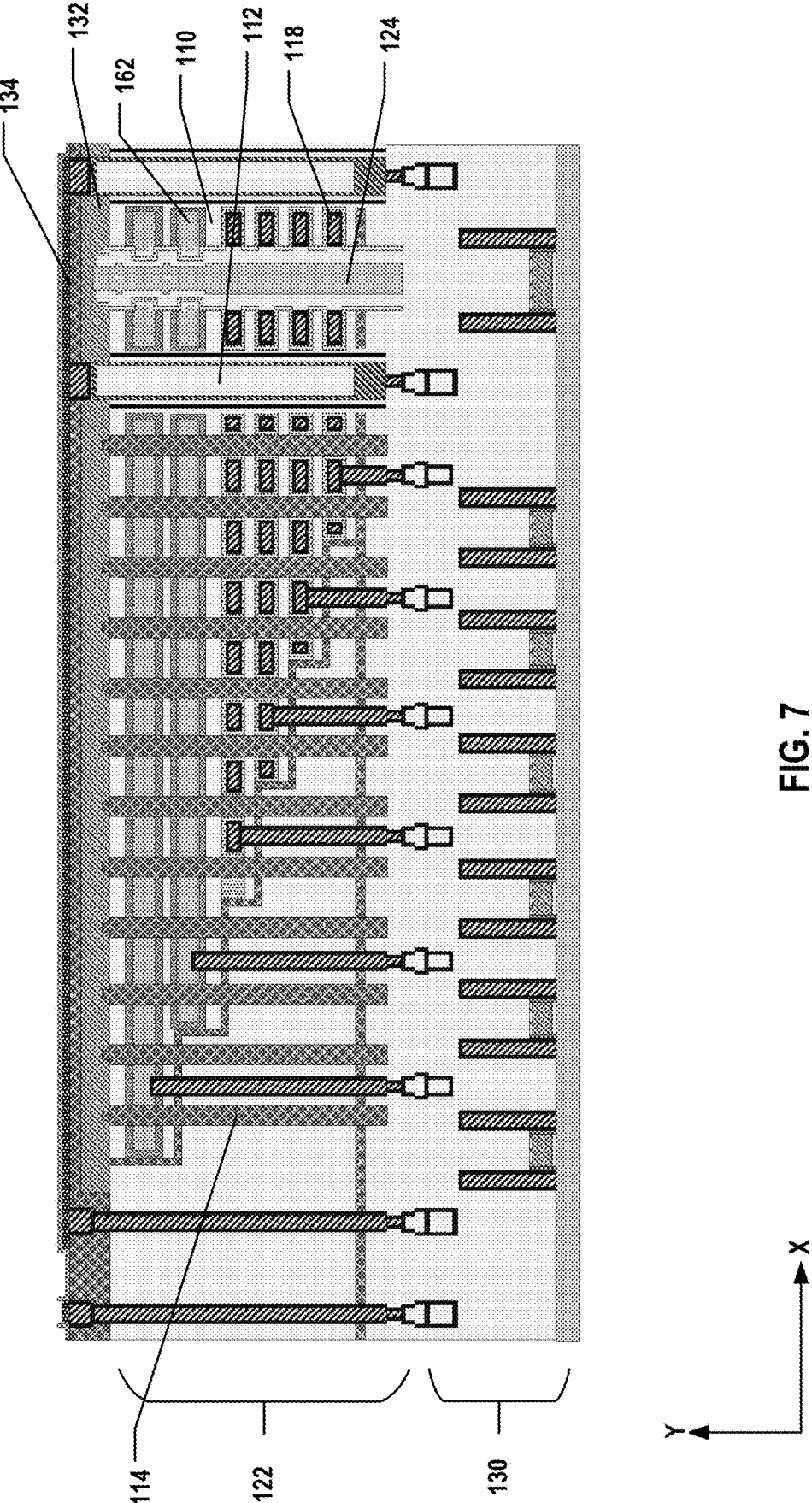

As shown in FIG. 7, a source contact is formed in contact with doped semiconductor layer 132. In some implementations, an interconnection structure 134 may be formed on doped semiconductor layer 132. Interconnection structure 134 may include one or more ILD layers on doped semiconductor layer 132 and a redistribution layer on the ILD layers. The source end of channel structure 112 may be coupled to the redistribution layer through the source contact.

FIGS. 9-17 illustrate a fabrication process for forming another exemplary 3D memory device 400, according to some aspects of the present disclosure. FIG. 18 illustrates a flowchart of another exemplary method 500 for forming 3D memory device 400, according to some aspects of the present disclosure. For the purpose of better describing the present disclosure, the cross-sections of 3D memory device 400 in FIGS. 9-17 and method 500 in FIG. 18 will be discussed together. It is understood that the operations shown in method 500 are not exhaustive and that other operations may be performed as well before, after, or between any of the illustrated operations. Further, some of the operations may be performed simultaneously, or in a different order than shown in FIGS. 9-17 and FIG. 18.

Figure 9:
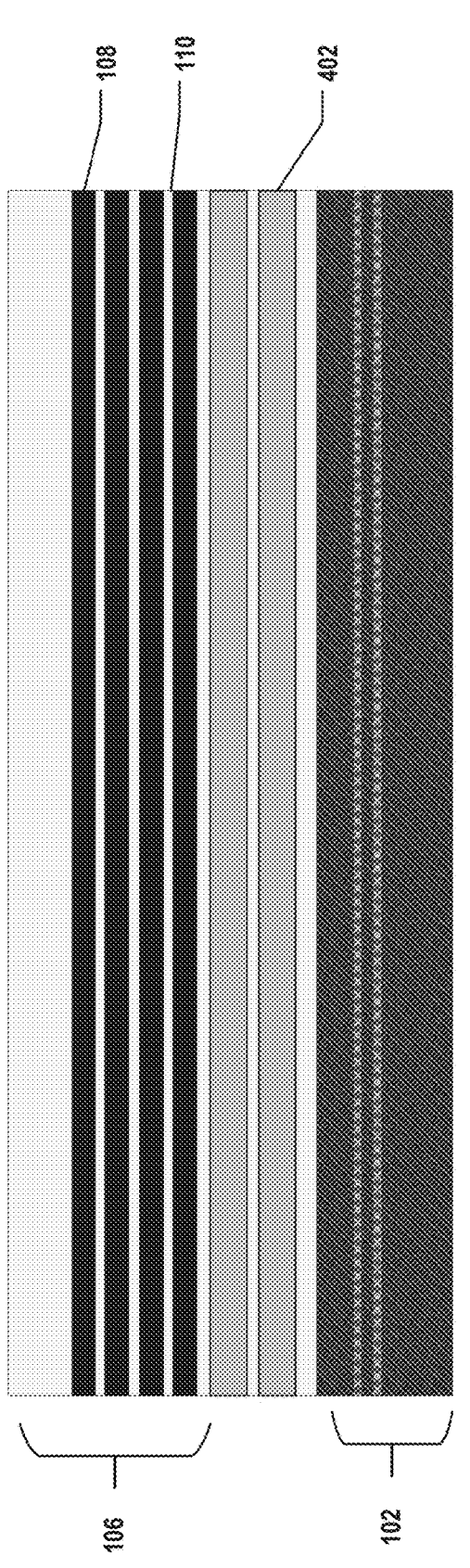

As shown in FIG. 9 and operation 502 of FIG. 18, a second sacrificial layer 402 is formed on semiconductor layer 102. In some implementations, semiconductor layer 102 may be a carrier substrate. In some implementations, the carrier substrate may be a doped semiconductor layer. In some implementations, an oxide layer may be formed between semiconductor layer 102 and second sacrificial layer 402 by depositing dielectric materials, such as silicon oxide, on semiconductor layer 102. In some implementations, second sacrificial layer 402 may include polysilicon, high-k dielectric, or metal. Second sacrificial layer 402 may be used for forming the source select gate line in a later operation.

Then, as shown in FIG. 9 and operation 504 of FIG. 18, dielectric stack 106 including first dielectric layers 110 and second dielectric layers 108 is formed on second sacrificial layer 402. Second sacrificial layer 402 and second dielectric layers 108 are formed by different materials. The dielectric stack 106 includes interleaved first dielectric layers 110 and second dielectric layers 108 extending in the x-direction. In some implementations, each first dielectric layer 110 may include silicon oxide, and each second dielectric layers 108 may include silicon nitride. Dielectric stack 106 may be formed by one or more thin film deposition processes including, but not limited to, CVD, PVD, ALD, or any combination thereof.

Figure 10:
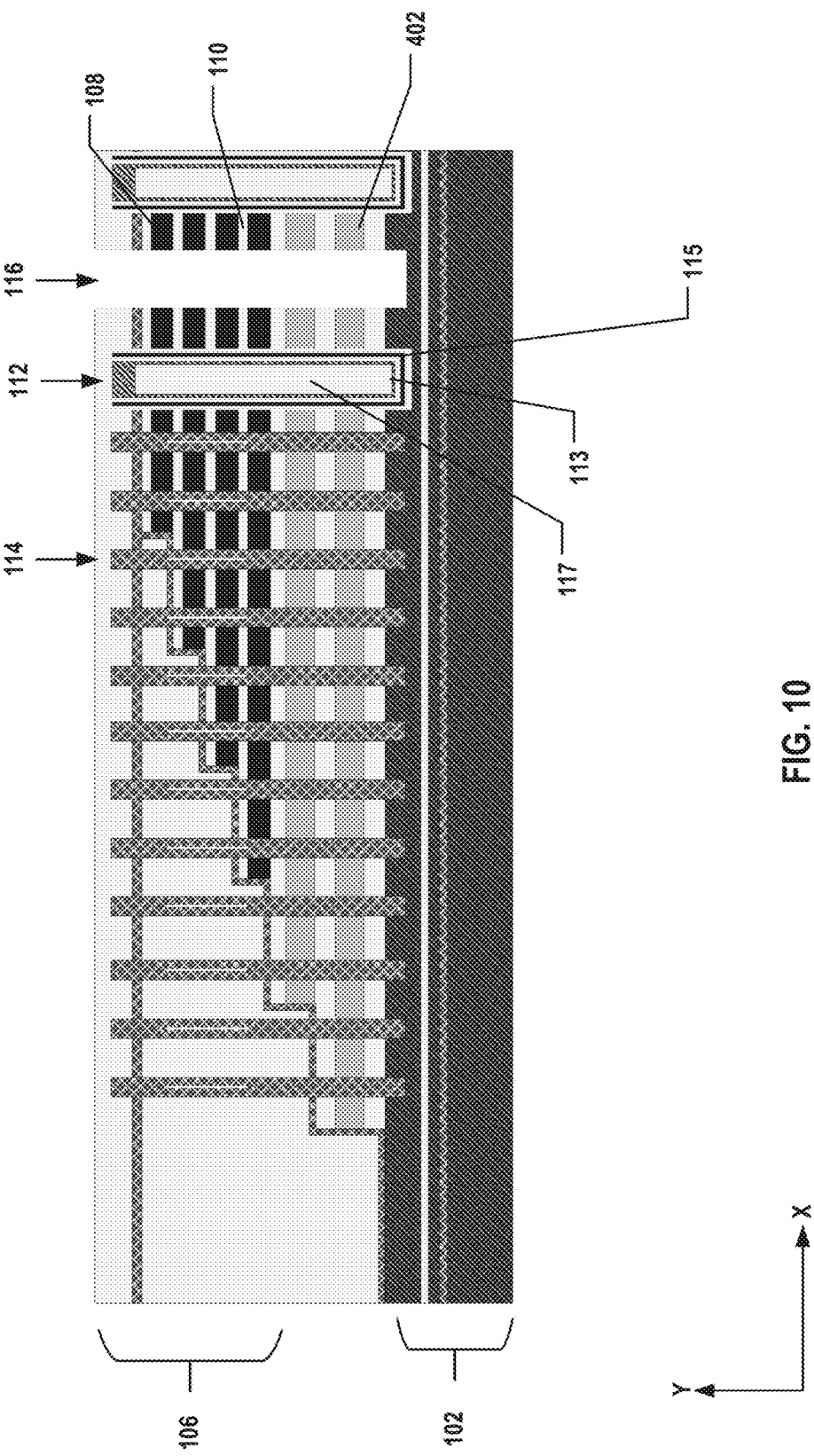

As shown in FIG. 10 and operation 506 of FIG. 18, channel structure 112 is formed extending vertically through dielectric stack 106 and sacrificial layer. Channel structure 112 includes semiconductor channel 113 and memory film 115.

As illustrated in FIG. 10, a staircase structure is formed on the edge of dielectric stack 106 and second sacrificial layer 402. The staircase structure may be formed by performing a plurality of so-called "trim-etch" cycles to the dielectric layer pairs of dielectric stack 106 and second sacrificial layer 402. Due to the repeated trim-etch cycles applied to the dielectric layer pairs of dielectric stack 106, dielectric stack 106 can have one or more tilted edges and a top dielectric layer pair shorter than the bottom one, as shown in FIG. 10.

Channel structure 112 is formed extending vertically through dielectric stack 106 and second sacrificial layer 402. Channel structure 112 includes semiconductor channel 113, and memory film 115, including the third dielectric layer, the fourth dielectric layer, and the fifth dielectric layer, over semiconductor channel 113. In some implementations, to form channel structure 112, a channel hole extending through dielectric stack 106 and second sacrificial layer 402 is formed.

The third dielectric layer, the fourth dielectric layer, and the fifth dielectric layer may be the blocking layer, the storage layer, and the tunneling layer. The blocking layer, the storage layer, the tunneling layer, and semiconductor channel 113 are sequentially formed in the channel hole. In some implementations, the fourth dielectric layer includes a dielectric material different from the third and fifth dielectric layers. For example, the fourth dielectric layer may include silicon nitride, and the third and fifth dielectric layers may include silicon oxide.

Each channel hole is an opening extending vertically through and beyond dielectric stack 106 and second sacrificial layer 402. In some implementations, a plurality of openings are formed, such that each opening becomes the location for growing an individual channel structure 112 in the later process. In some implementations, fabrication processes for forming the channel holes of channel structures 112 include wet etching and/or dry etching, such as DRIE.

Memory film 115 (the third dielectric layer, the fourth dielectric layer, and the fifth dielectric layer), and semiconductor channel 113 are sequentially formed in this order along sidewalls and the bottom surface of the channel hole. In some implementations, memory film 115 is first deposited along the sidewalls and bottom surface of the channel hole using one or more thin film deposition processes, such as ALD, CVD, PVD, any other suitable processes, or any combination thereof. Semiconductor channel 113 then may be formed by depositing a semiconductor material, such as polysilicon (e.g., undoped polysilicon), over memory film 115 using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "ONOP" structure) are sequentially deposited to form memory film 115 and semiconductor channel 113.

Capping layer 117 may be formed in the channel hole and over semiconductor channel 113 to fully or partially fill the channel hole (e.g., without or with an air gap). Capping layer 117 can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some implementations, one or more than one dummy channel structure 114 may also be formed extending vertically through dielectric stack 106 and second sacrificial layer 402.

As illustrated in FIG. 10, opening 116 may be formed extending vertically through dielectric stack 106 and second sacrificial layer 402. In some implementations, fabrication processes for forming opening 116 include wet etching and/or dry etching, such as DRIE.

Figure 11:
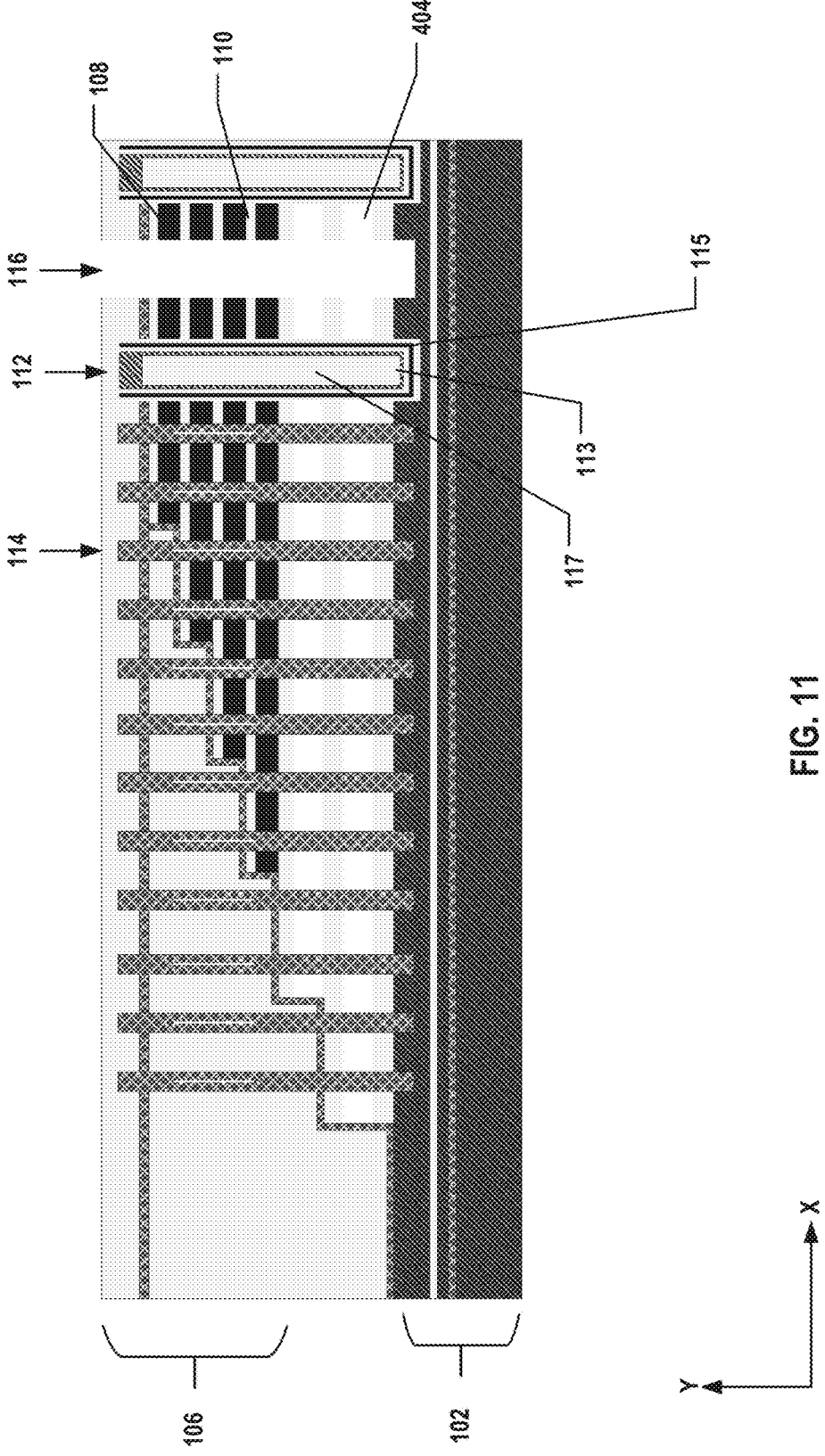

As illustrated in FIG. 11 and operation 508 in FIG. 18, second sacrificial layer 402 is removed to form a cavity 404 and expose a portion of channel structure 112. In some implementations, second sacrificial layer 402 may be a polysilicon layer or a silicon nitride layer and may be removed by wet etch, dry etch, or other suitable processes.

Figure 12:
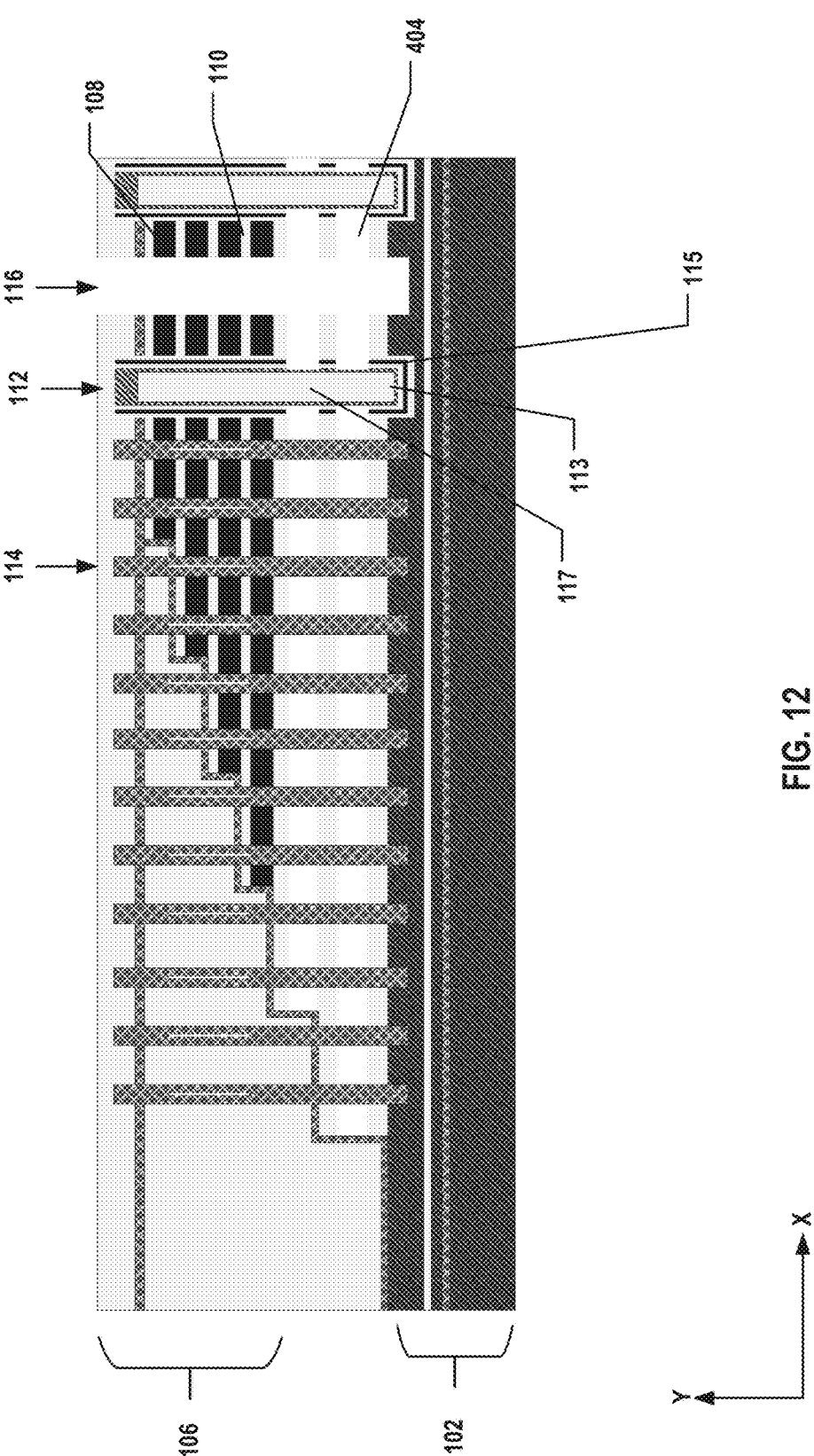

Then, as shown in FIG. 12 and operation 510 in FIG. 18, a portion of sidewalls of channel structure 112 is removed. Specifically, memory film 115, including the tunneling layer, the storage layer, and the blocking layer, on sidewalls of channel structure 112 exposed to cavity 404 is removed until exposing semiconductor channel 113. It is understood operation 508 and operation 510 may be performed in one etch operation. For example, the etching operation may first remove second sacrificial layer 402 to form cavity 404 and then remove memory film 115 exposed to cavity 404. In some implementations, operation 508 and operation 510 may be performed in different etching processes.

Figure 13:
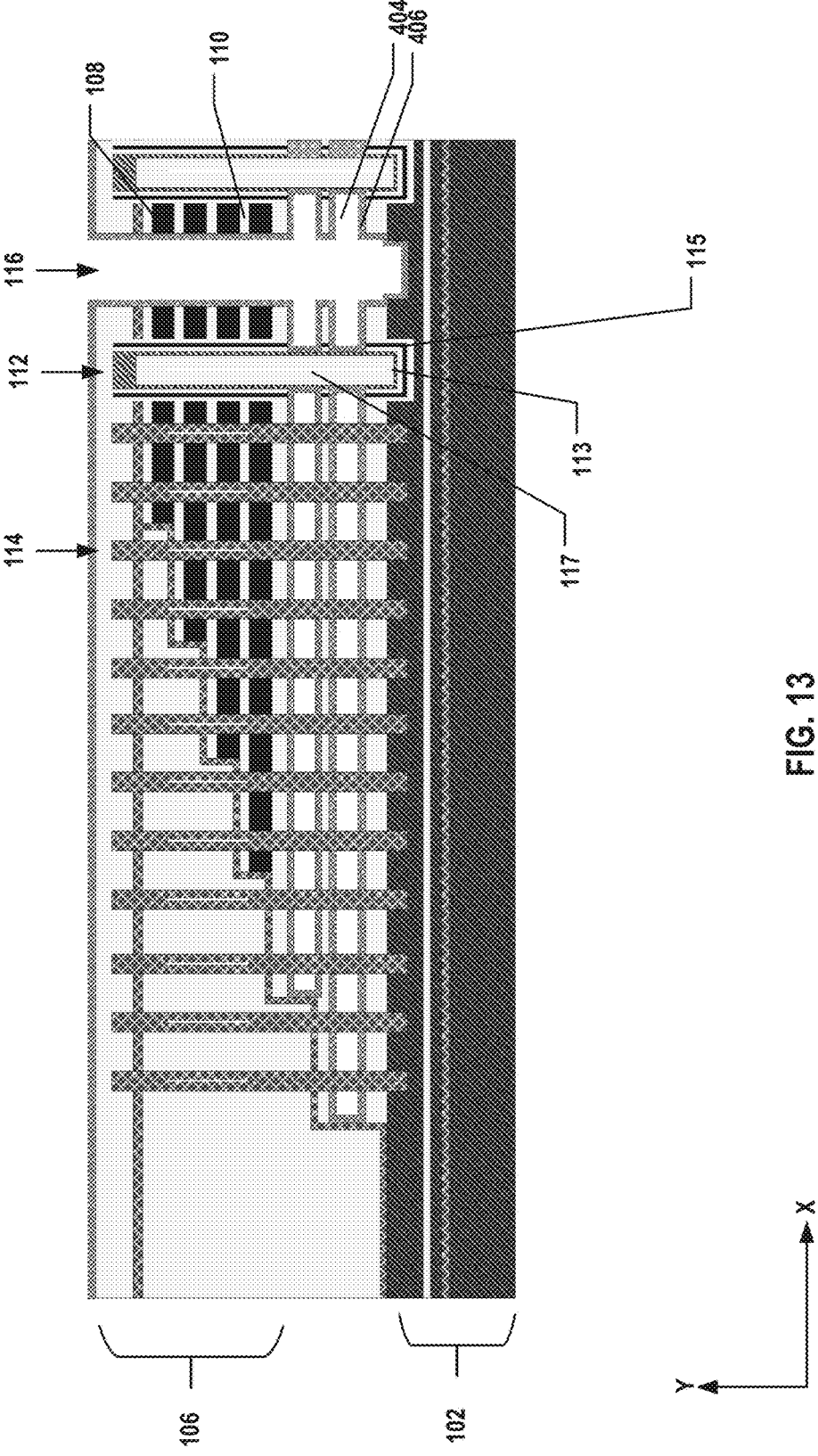

As shown in FIG. 13 and FIG. 14, and operation 512 in FIG. 18, a source select gate line is formed in cavity 404 in direct contact with semiconductor channel 113 of channel structure 112. In some implementations, the formation of source select gate line 408 may include firstly forming dielectric layer 406 on the sidewalls of cavity 404 and opening 116, as shown in FIG. 13. Dielectric layer 406 directly contacts semiconductor channel 113. In some implementations, dielectric layer 406 may include silicon oxide and may be formed by ALD, PVD, CVD, or other suitable processes. In some implementations, dielectric layer 406 may include silicon nitride, high-k dielectric materials, or other suitable materials. Then, source select gate line 408 is formed on dielectric layer 406 in cavity 404 and opening 116, as shown in FIG. 14. In some implementations, source select gate line 408 may include polysilicon. For example, the polysilicon layer may be formed by the atmospheric pressure CVD (APCVD) process to form in-situ n+ doped polysilicon.

Then, as shown in FIG. 15, partials of dielectric layer 406 and source select gate line 408 formed on sidewalls of opening 116 and on dielectric stack 106 are removed. In some implementations, partials of dielectric layer 406 and source select gate line 408 formed on sidewalls of opening 116 and on dielectric stack 106 may be removed by dry etch, wet etch, or other suitable processes.

FIG. 15 illustrates that source select gate line 408 include polysilicon. However, in some other implementations, after removing dielectric layer 406 and source select gate line 408 formed on sidewalls of opening 116, source select gate line 408 and second dielectric layers 108 may be removed in the later processes. Then conductive layers 118 may be used to replace source select gate line 408 and second dielectric layers 108. In other words, in some other implementations, the word lines and the source select gate line may be formed by the same material, e.g., tungsten.

Figure 16:
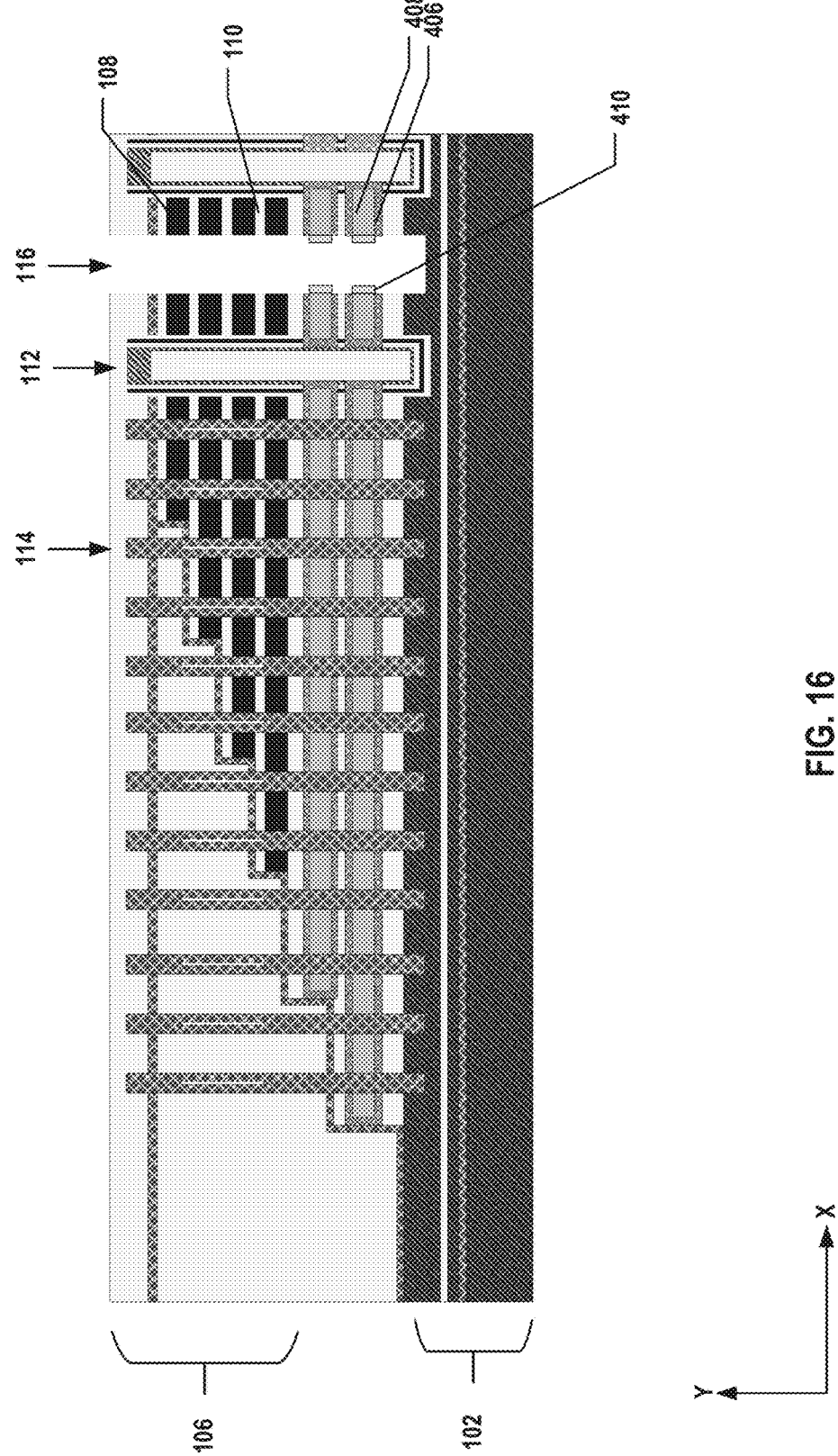

As shown in FIG. 16, a dielectric layer 410 may be formed on source select gate line 408 exposed to opening 116. In some implementations, dielectric layer 410 may be used to protect source select gate line 408 during a later word line replacement operation. In some implementations, dielectric layer 410 may be formed by depositing a dielectric material onto source select gate line 408 exposed to opening 116. In some implementations, dielectric layer 410 may be formed by performing an oxidation operation on source select gate line 408 exposed to opening 116 to oxidate the surface of source select gate line 408 exposed to opening 116 to dielectric layer 410.

As shown in FIG. 17 and operation 514 in FIG. 18, the plurality of second dielectric layers 108 are replaced with a plurality of word lines. In some implementations, a plurality of cavities may be first formed by removing second dielectric layers 108 through opening 116. In some implementations, second dielectric layers 108 are removed by applying etchants through opening 116, creating cavities interleaved between first dielectric layers 110. The etchants can include any suitable etchants that etch second dielectric layers 108 selective to first dielectric layers 110. Since source select gate line 408 is covered by dielectric layer 410, source select gate line 408 will not be removed in operation 514.

Then, the word lines (including conductive layers 118 and adhesive layers) are deposited into the cavities through opening 116. In some implementations, a gate dielectric layer is deposited into the cavities prior to conductive layers 118, such that conductive layers 118 are deposited on the gate dielectric layer. Conductive layers 118, such as metal layers, can be deposited using one or more thin film deposition processes, such as ALD, CVD, PVD, any other suitable processes, or any combination thereof. In some implementations, the gate dielectric layer, such as a high-k dielectric layer, is formed along the sidewall and at the bottom of opening 116 as well. Memory stack 122 including interleaved conductive layers 118 and first dielectric layers 110 is thereby formed, replacing dielectric stack 106, according to some implementations.

Slit structure 124 extending vertically through memory stack 122 is formed. Slit structure 124 may be formed by depositing one or more dielectric materials, such as silicon oxide, into opening 116 to fully or partially fill opening 116 (with or without an air gap) using one or more thin film deposition processes, such as ALD, CVD, PVD, any other suitable processes, or any combination thereof. In some implementations, slit structure 124 includes the gate dielectric layer (e.g., including high-k dielectrics) and a dielectric capping layer (e.g., including silicon oxide). In some implementations, the dielectric capping layer may partially fill opening 116, and a polysilicon core layer may fill the remaining space of opening 116 as part of slit structure 124 to adjust the mechanical properties, such as hardness or stress, of slit structure 124.

FIGS. 19-30 illustrate a fabrication process for forming an exemplary 3D memory device 600, according to some aspects of the present disclosure. FIG. 31 illustrates a flowchart of an exemplary method 700 for forming 3D memory device 600, according to some aspects of the present disclosure. For the purpose of better describing the present disclosure, the cross-sections of 3D memory device 600 in FIGS. 19-30 and method 700 in FIG. 31 will be discussed together. It is understood that the operations shown in method 700 are not exhaustive and that other operations may be performed as well before, after, or between any of the illustrated operations. Further, some of the operations may be performed simultaneously, or in a different order than shown in FIGS. 19-30 and FIG. 31.

Figure 19:
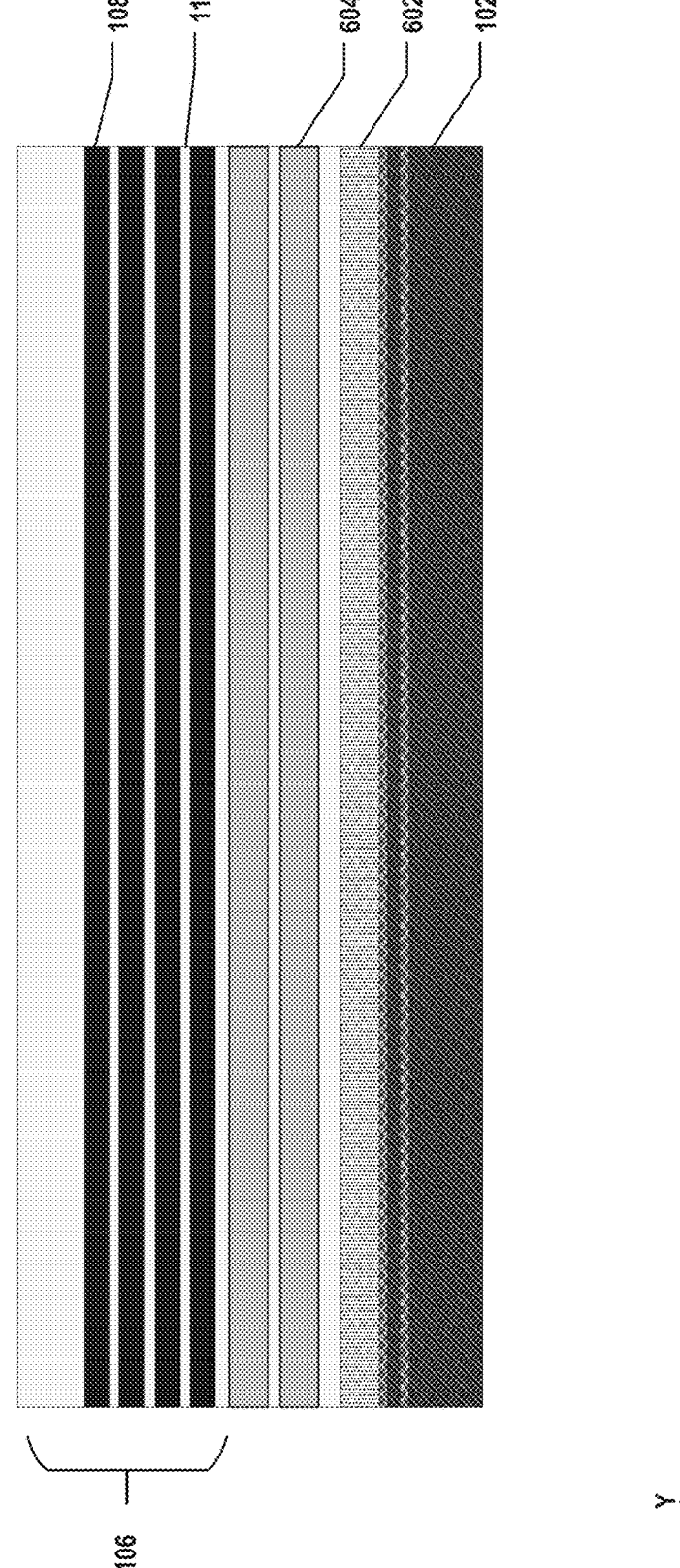

As shown in FIG. 19 and operation 702 of FIG. 31, a third sacrificial layer 602 is formed on semiconductor layer 102. In some implementations, semiconductor layer 102 may be a carrier substrate. In some implementations, the carrier substrate may be a doped semiconductor layer. In some implementations, a pad oxide layer may be formed between semiconductor layer 102 and third sacrificial layer 602 by depositing dielectric materials, such as silicon oxide, on semiconductor layer 102.

In some implementations, third sacrificial layer 602 may include polysilicon, high-k dielectric, or metal. In some implementations, third sacrificial layer 602 may include tungsten. Third sacrificial layer 602 may act as an etch stop layer when forming the channel structure, the dummy channel structure, the gate line slit structure, and/or the contact structure in a later operation.

As shown in FIG. 19 and operation 704 of FIG. 31, a fourth sacrificial layer 604 is formed on third sacrificial layer 602. Third sacrificial layer 602 and fourth sacrificial layer 604 may be formed by different materials. In some implementations, fourth sacrificial layer 604 may include polysilicon, high-k dielectric, or metal. Fourth sacrificial layer 604 may be used for forming the source select gate line in a later operation.

Then, as shown in FIG. 19 and operation 706 of FIG. 31, dielectric stack 106 including first dielectric layers 110 and second dielectric layers 108 is formed on fourth sacrificial layer 604. Fourth sacrificial layer 604 and second dielectric layers 108 are formed by different materials. The dielectric stack 106 includes interleaved first dielectric layers 110 and second dielectric layers 108 extending in the x-direction. In some implementations, each first dielectric layer 110 may include silicon oxide, and each second dielectric layer 108 may include silicon nitride. Dielectric stack 106 may be formed by one or more thin film deposition processes including, but not limited to, CVD, PVD, ALD, or any combination thereof.

Figure 20:
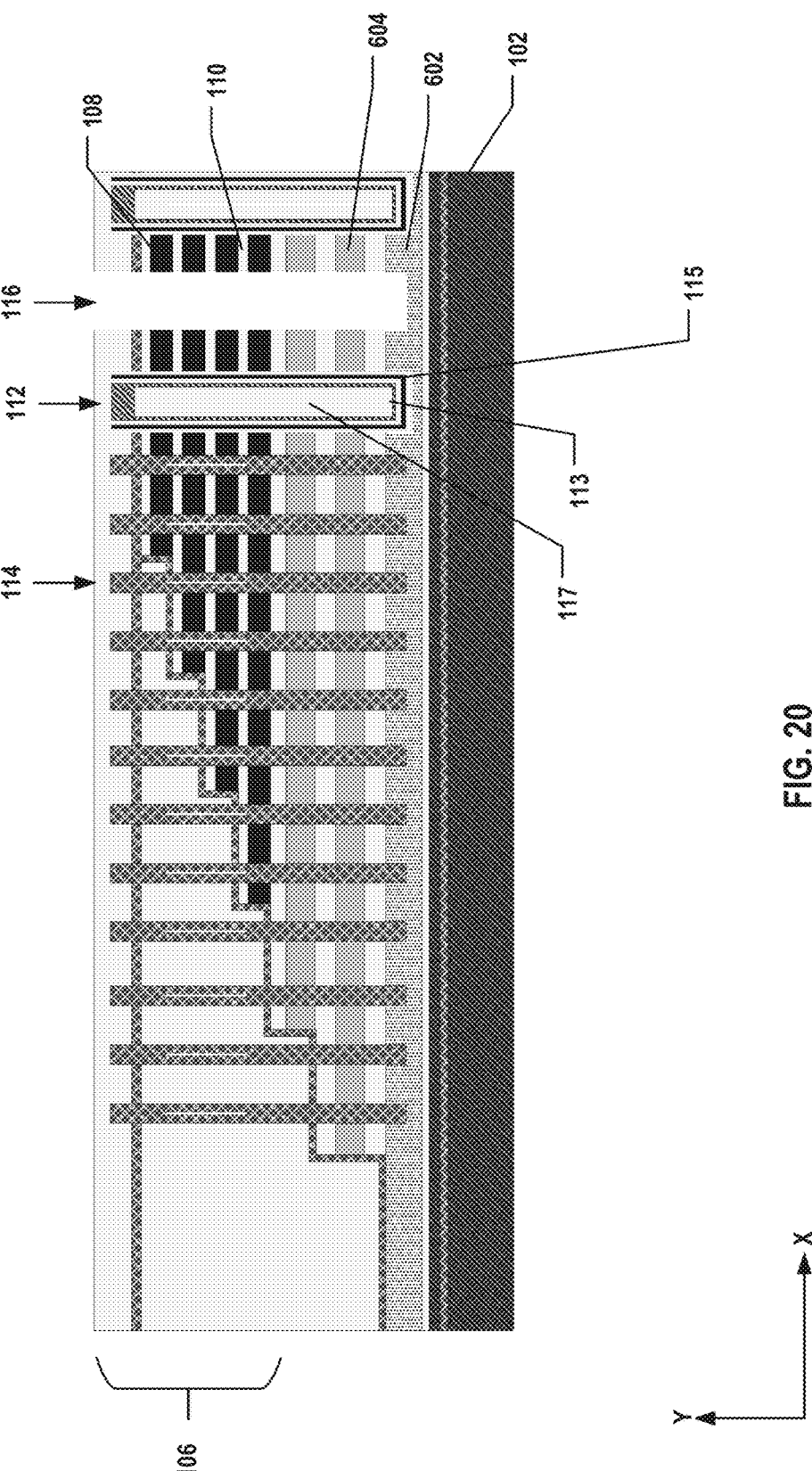

As shown in FIG. 20 and operation 708 of FIG. 31, channel structure 112 is formed extending vertically through dielectric stack 106 and fourth sacrificial layer 604 in contact with third sacrificial layer 602. Channel structure 112 includes semiconductor channel 113 and memory film 115.

As illustrated in FIG. 20, a staircase structure is formed on the edge of dielectric stack 106 and fourth sacrificial layer 604. The staircase structure may be formed by performing a plurality of so-called "trim-etch" cycles to the dielectric layer pairs of dielectric stack 106 and fourth sacrificial layer 604. Due to the repeated trim-etch cycles applied to the dielectric layer pairs of dielectric stack 106 and fourth sacrificial layer 604, dielectric stack 106 and fourth sacrificial layer 604 can have one or more tilted edges and a top dielectric layer pair shorter than the bottom one, as shown in FIG. 20.

Channel structure 112 is formed extending vertically through dielectric stack 106 and fourth sacrificial layer 604 in contact with third sacrificial layer 602. Channel structure 112 includes semiconductor channel 113, and memory film 115, including the third dielectric layer, the fourth dielectric layer, and the fifth dielectric layer, over semiconductor channel 113. In some implementations, to form channel structure 112, a channel hole extending through dielectric stack 106 and fourth sacrificial layer 604 is formed, stopping at third sacrificial layer 602.

The third dielectric layer, the fourth dielectric layer, the fifth dielectric layer, and semiconductor channel 113 are sequentially formed in the channel hole. In some implementations, the fourth dielectric layer includes a dielectric material different from the third and fifth dielectric layers. For example, the fourth dielectric layer may include silicon nitride, and the third and fifth dielectric layers may include silicon oxide.

Each channel hole is an opening extending vertically through and beyond dielectric stack 106 and fourth sacrificial layer 604, stopping at third sacrificial layer 602. In some implementations, a plurality of openings are formed, such that each opening becomes the location for growing an individual channel structure 112 in the later process. In some implementations, fabrication processes for forming the channel holes of channel structures 112 include wet etching and/or dry etching, such as DRIE. The etching of the channel holes continues until being stopped by third sacrificial layer 602, such as silicon oxide or polysilicon, according to some implementations. In some implementations, the etching conditions, such as etching rate and time, can be controlled to ensure that each channel hole has reached and stopped by third sacrificial layer 602 to minimize the gouging variations among the channel holes and channel structures 112 formed therein. It is understood that depending on the specific etching selectivity, one or more channel holes may extend into third sacrificial layer 602 to a small extent, which is still viewed as being stopped by third sacrificial layer 602 in the present disclosure.

Memory film 115 (the third dielectric layer, the fourth dielectric layer, and the fifth dielectric layer), and semiconductor channel 113 are sequentially formed in this order along sidewalls and the bottom surface of the channel hole. In some implementations, memory film 115 is first deposited along the sidewalls and bottom surface of the channel hole using one or more thin film deposition processes, such as ALD, CVD, PVD, any other suitable processes, or any combination thereof. Semiconductor channel 113 then may be formed by depositing a semiconductor material, such as polysilicon (e.g., undoped polysilicon), over memory film 115 using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "ONOP" structure) are sequentially deposited to form memory film 115 and semiconductor channel 113.

Capping layer 117 may be formed in the channel hole and over semiconductor channel 113 to fully or partially fill the channel hole (e.g., without or with an air gap). Capping layer 117 can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some implementations, one or more than one dummy channel structure 114 may also be formed extending vertically through dielectric stack 106 and fourth sacrificial layer 604 in contact with third sacrificial layer 602.

As illustrated in FIG. 20, opening 116 may be formed extending vertically through dielectric stack 106 and fourth sacrificial layer 604 and expose third sacrificial layer 602. In some implementations, fabrication processes for forming opening 116 include wet etching and/or dry etching, such as DRIE. A gate replacement then can be performed through opening 116 to replace second dielectric layers 108 with word lines in a later operation. In addition, a source select gate line formation operation may also be performed through opening 116 to replace sacrificial layers 604 with source select gate line in a later operation.

Figure 21:
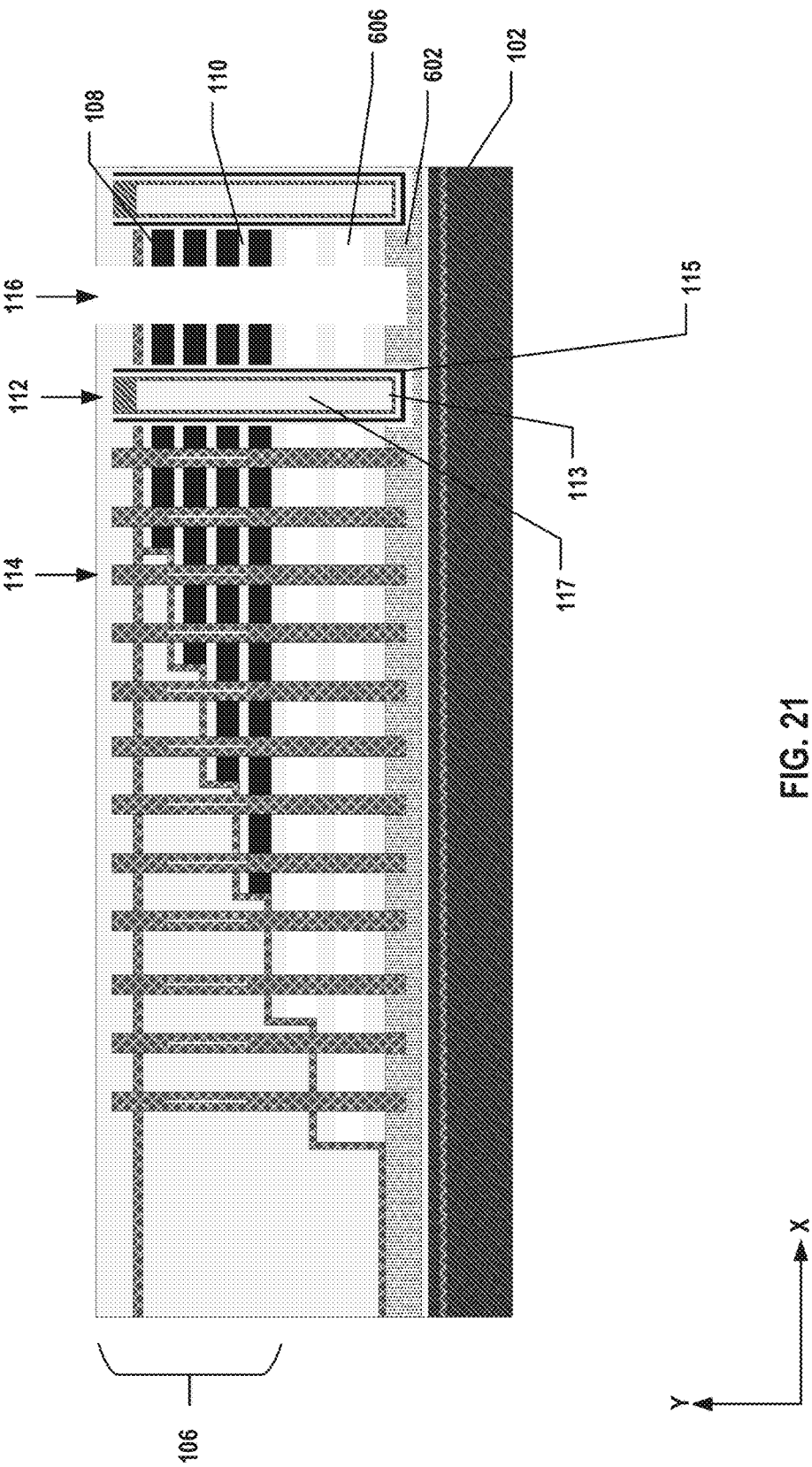

As illustrated in FIG. 21 and operation 710 of FIG. 31, fourth sacrificial layer 604 is removed to form a cavity 606 and expose a portion of channel structure 112. In some implementations, fourth sacrificial layer 604 may be a polysilicon layer or a silicon nitride layer and may be removed by wet etch, dry etch, or other suitable processes.

Figure 22:
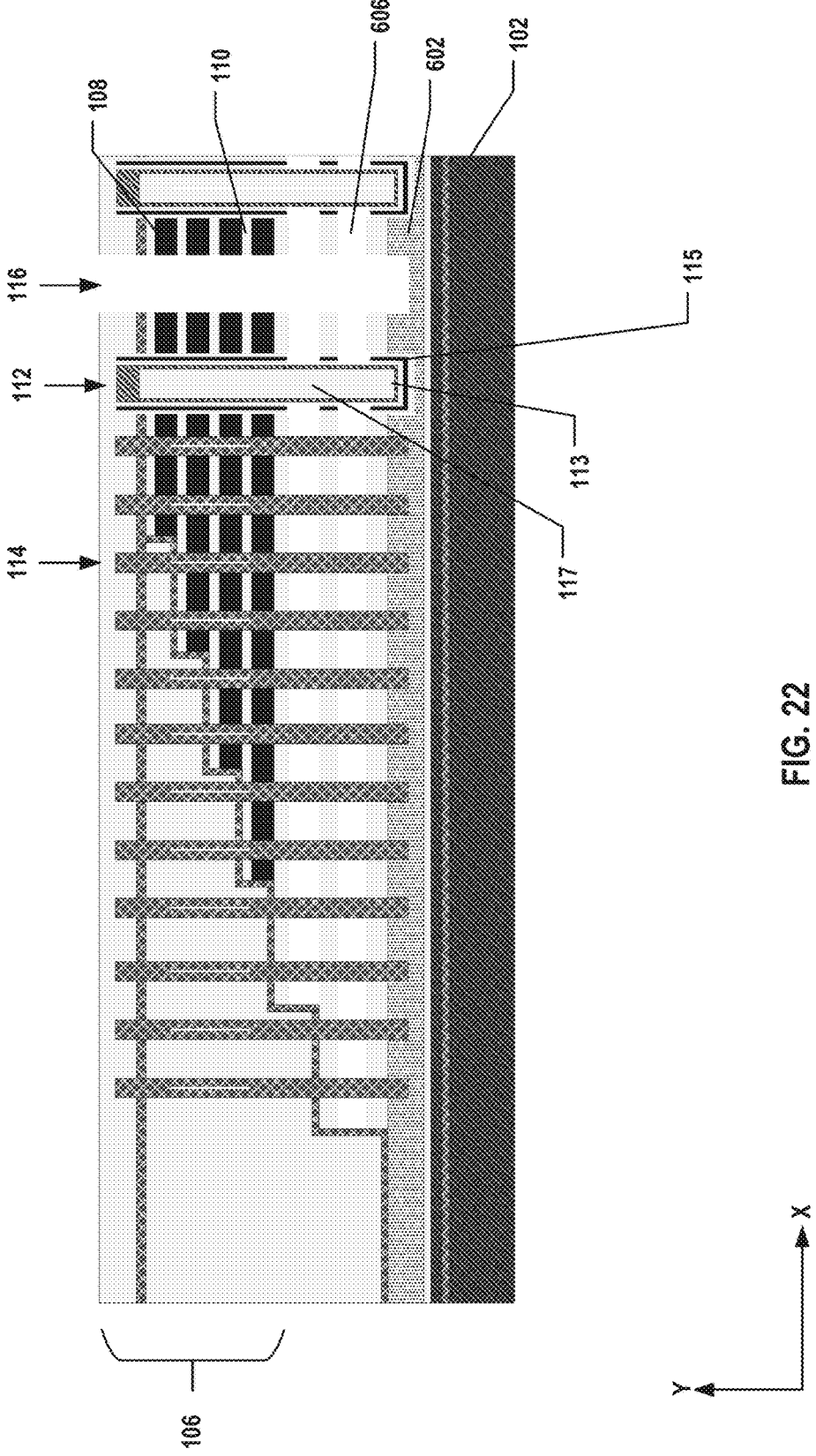

Then, as shown in FIG. 22 and operation 712 in FIG. 31, a portion of sidewalls of channel structure 112 is removed. Specifically, memory film 115, including the tunneling layer, the storage layer, and the blocking layer, on sidewalls of channel structure 112 exposed to cavity 606 is removed until exposing semiconductor channel 113. It is understood operation 710 and operation 712 may be performed in one etch operation. For example, the etching operation may first remove fourth sacrificial layer 604 to form cavity 606 and then continue to remove memory film 115 exposed to cavity 606. In some implementations, operation 710 and operation 712 may be performed in different etching processes.

Figure 23:

As shown in FIG. 23 and FIG. 24, and operation 714 in FIG. 31, source select gate conductive layer 610 is formed in cavity 606 in direct contact with semiconductor channel 113 of channel structure 112. In some implementations, the formation of source select gate conductive layer 610 may include firstly forming source select gate dielectric layer 608 on the sidewalls of cavity 606 and opening 116, as shown in FIG. 23. Source select gate dielectric layer 608 directly contacts semiconductor channel 113. In some implementations, source select gate dielectric layer 608 may include silicon oxide and may be formed by ALD, PVD, CVD, or other suitable processes. In some implementations, source select gate dielectric layer 608 may include silicon nitride, high-k dielectric materials, or other suitable materials. Then, source select gate conductive layer 610 is formed on source select gate dielectric layer 608 in cavity 606 and opening 116, as shown in FIG. 24. In some implementations, source select gate conductive layer 610 may be formed by poly-silicon. For example, the polysilicon layer may be formed by APCVD process to form in-situ n+ doped polysilicon.

Figure 25:
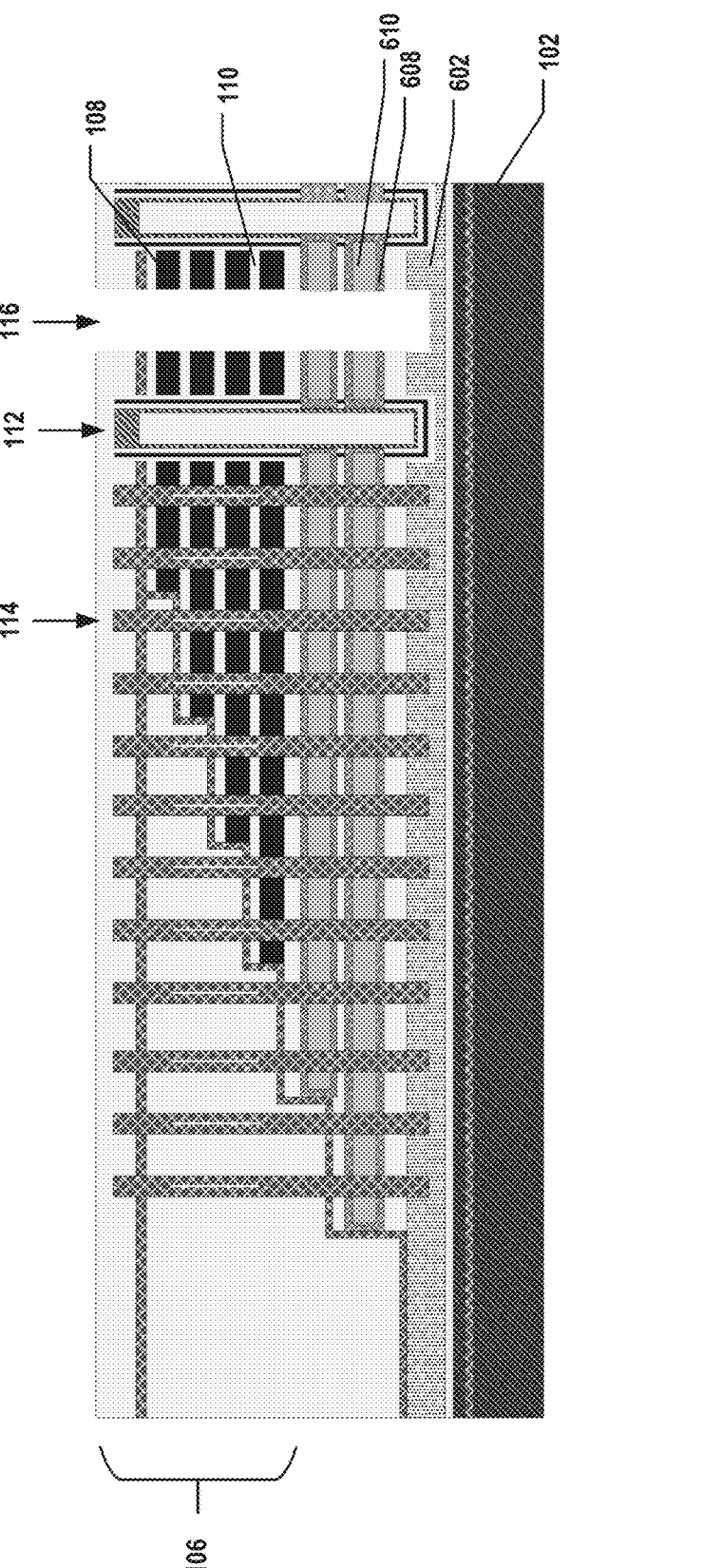

Then, as shown in FIG. 25, partials of source select gate dielectric layer 608 and source select gate conductive layer 610 formed on sidewalls of opening 116 and on dielectric stack 106 are removed. In some implementations, partials of source select gate dielectric layer 608 and source select gate conductive layer 610 formed on sidewalls of opening 116 and on dielectric stack 106 may be removed by dry etch, wet etch, or other suitable processes.

FIG. 25 illustrates that source select gate conductive layer 610 include polysilicon. However, in some other implementations, after removing source select gate dielectric layer 608 and source select gate conductive layer 610 formed on sidewalls of opening 116, source select gate conductive layer 610 and second dielectric layers 108 may be removed in the later processes. Then conductive layers 118 may be used to replace source select gate conductive layer 610 and second dielectric layers 108. In other words, in some other implementations, the word lines and the source select gate line may be formed by the same material, e.g., tungsten.

Figure 26:
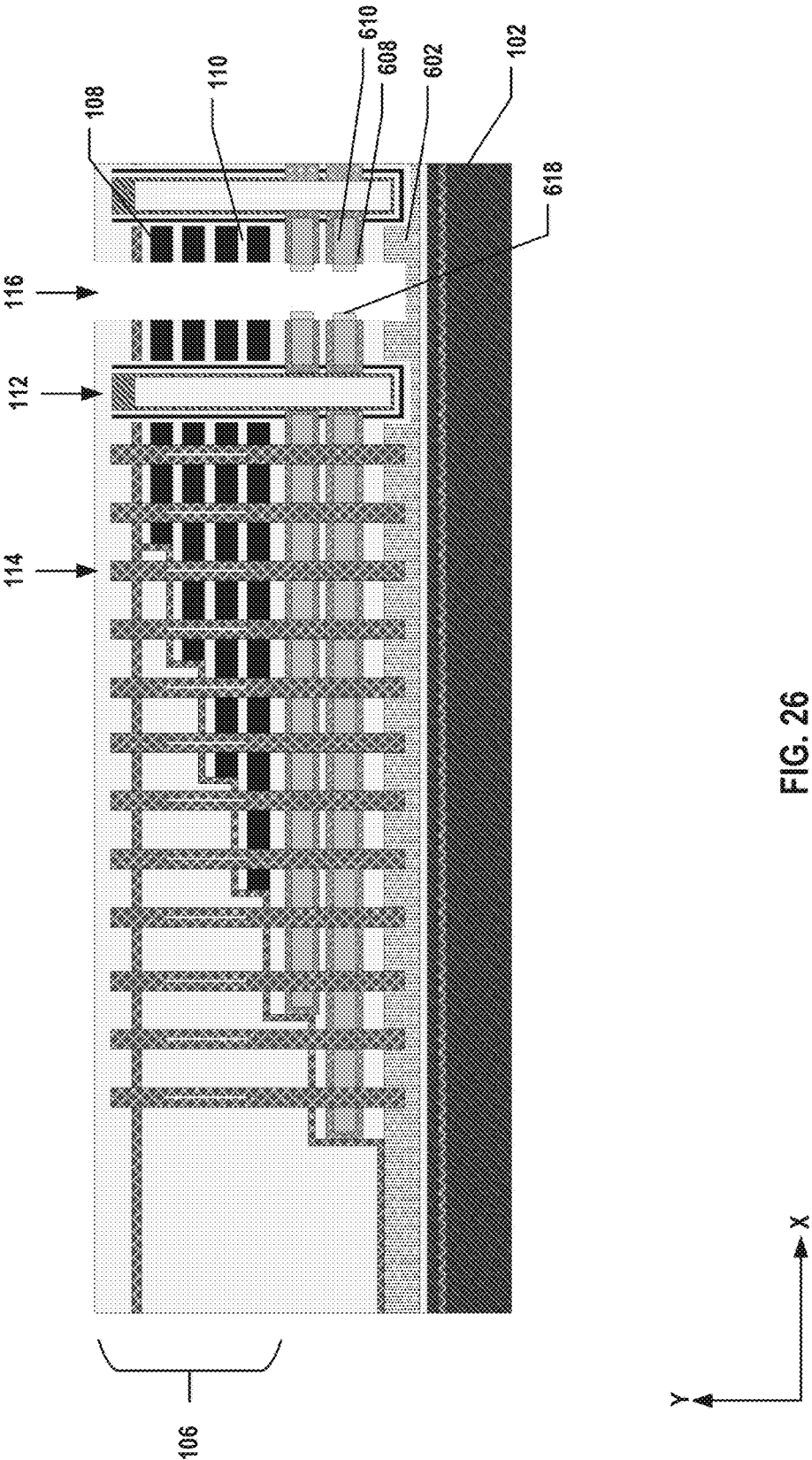

As shown in FIG. 26, a dielectric layer 618 may be formed on source select gate conductive layer 610 exposed to opening 116. In some implementations, dielectric layer 618 may be used to protect source select gate conductive layer 610 during a later word line replacement operation. In some implementations, dielectric layer 618 may be formed by depositing a dielectric material onto source select gate conductive layer 610 exposed to opening 116. In some implementations, dielectric layer 618 may be formed by performing an oxidation operation on source select gate conductive layer 610 exposed to opening 116 to oxidate the surface of source select gate conductive layer 610 exposed to opening 116 to dielectric layer 618.

Figure 27:
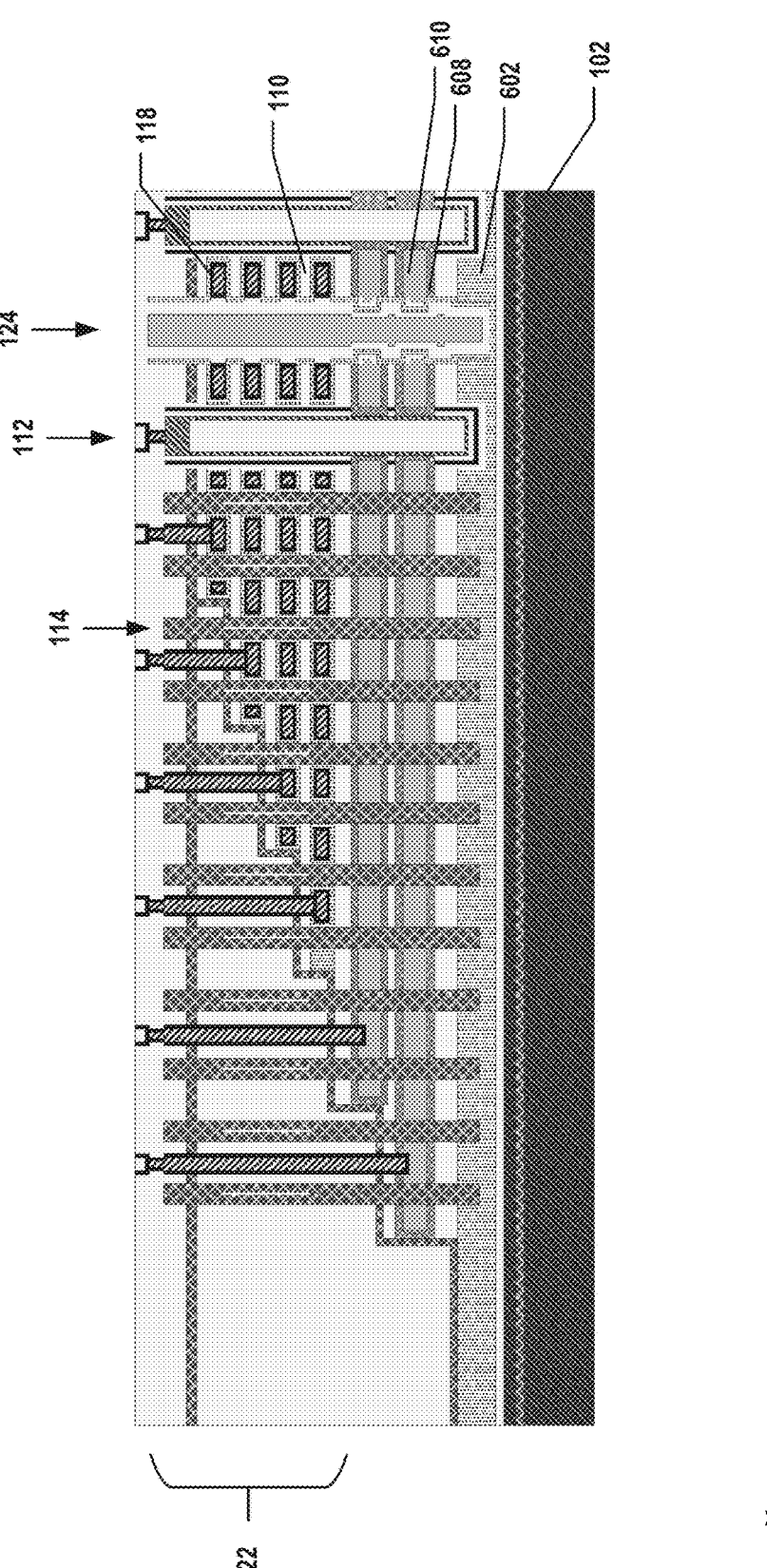

As shown in FIG. 27 and operation 716 of FIG. 31, the plurality of second dielectric layers 108 are replaced with a plurality of word lines 118. In some implementations, a plurality of cavities may be first formed by removing second dielectric layers 108 through opening 116. In some implementations, second dielectric layers 108 are removed by applying etchants through opening 116, creating cavities interleaved between first dielectric layers 110. The etchants can include any suitable etchants that etch second dielectric layers 108 selective to first dielectric layers 110. Furthermore, the etchants can include any suitable etchants that etch second dielectric layers 108 selective to third sacrificial layer 602. Since source select gate conductive layer 610 is covered by dielectric layer 618, source select gate conductive layer 610 will not be removed in operation 716.

Then, the word lines (including conductive layers 118 and adhesive layers) are deposited into the cavities through opening 116. In some implementations, a gate dielectric layer is deposited into the cavities prior to conductive layers 118, such that conductive layers 118 are deposited on the gate dielectric layer. Conductive layers 118, such as metal layers, can be deposited using one or more thin film deposition processes, such as ALD, CVD, PVD, any other suitable processes, or any combination thereof. In some implementations, the gate dielectric layer, such as a high-k dielectric layer, is formed along the sidewall and at the bottom of opening 116 as well. Memory stack 122 including interleaved conductive layers 118 and first dielectric layers 110 is thereby formed, replacing dielectric stack 106, according to some implementations.

A slit structure 124 extending vertically through memory stack 122 is formed, stopping on third sacrificial layer 602. Slit structure 124 may be formed by depositing one or more dielectric materials, such as silicon oxide, into opening 116 to fully or partially fill opening 116 (with or without an air gap) using one or more thin film deposition processes, such as ALD, CVD, PVD, any other suitable processes, or any combination thereof. In some implementations, slit structure 124 includes the gate dielectric layer (e.g., including high-k dielectrics) and a dielectric capping layer (e.g., including silicon oxide). In some implementations, the dielectric capping layer may partially fill opening 116, and a polysilicon core layer may fill the remaining space of opening 116 as part of slit structure 124 to adjust the mechanical properties, such as hardness or stress, of slit structure 124. After the formation of slit structure 124, local contacts, including channel local contacts, word line local contacts, and peripheral contacts may be formed. A bonding layer may be formed above channel local contacts, word line local contacts, and peripheral contacts.

Figure 28:
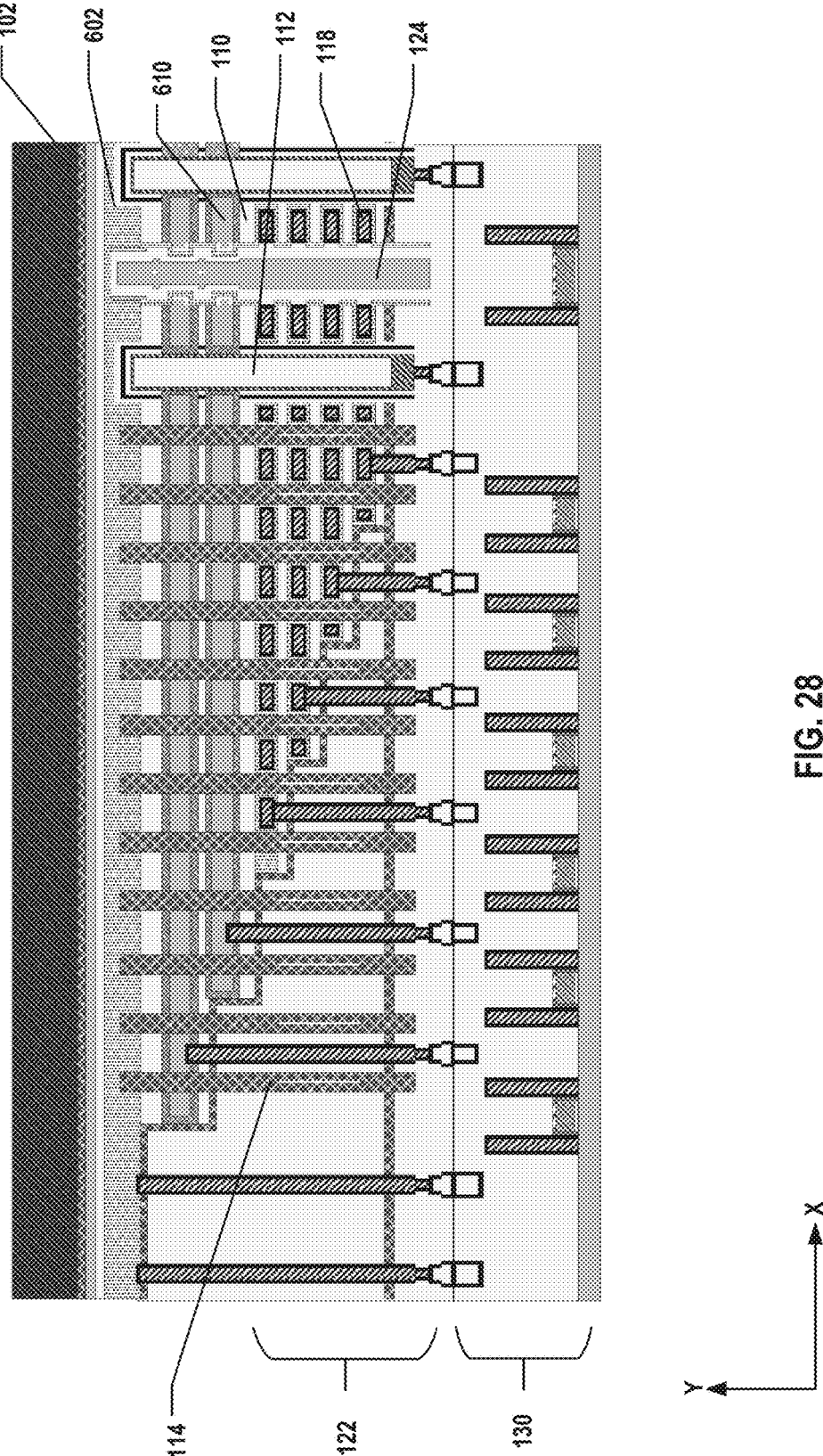

As shown in FIG. 28, peripheral circuit structure 130 and memory stack 122 are bonded in a face-to-face manner, such that memory stack 122 is above peripheral circuit structure 130. The bonding can include hybrid bonding. In some implementations, semiconductor layer 102 and components formed thereon (e.g., memory stack 122 and channel structures 112 formed therethrough) are flipped upside down. The bonding layer facing down is bonded with the bonding layer of peripheral circuit structure 130 facing up, i.e., in a face-to-face manner, thereby forming a bonding interface between peripheral circuit structure 130 and memory stack 122. In some implementations, a treatment process, e.g., a plasma treatment, a wet treatment, and/or a thermal treatment, is applied to the bonding surfaces prior to the bonding. After the bonding, memory stack 122 and channel structures 112 formed therethrough can be electrically connected to the peripheral circuits in peripheral circuit structure 130 and are above peripheral circuit structure 130.

Figure 29:
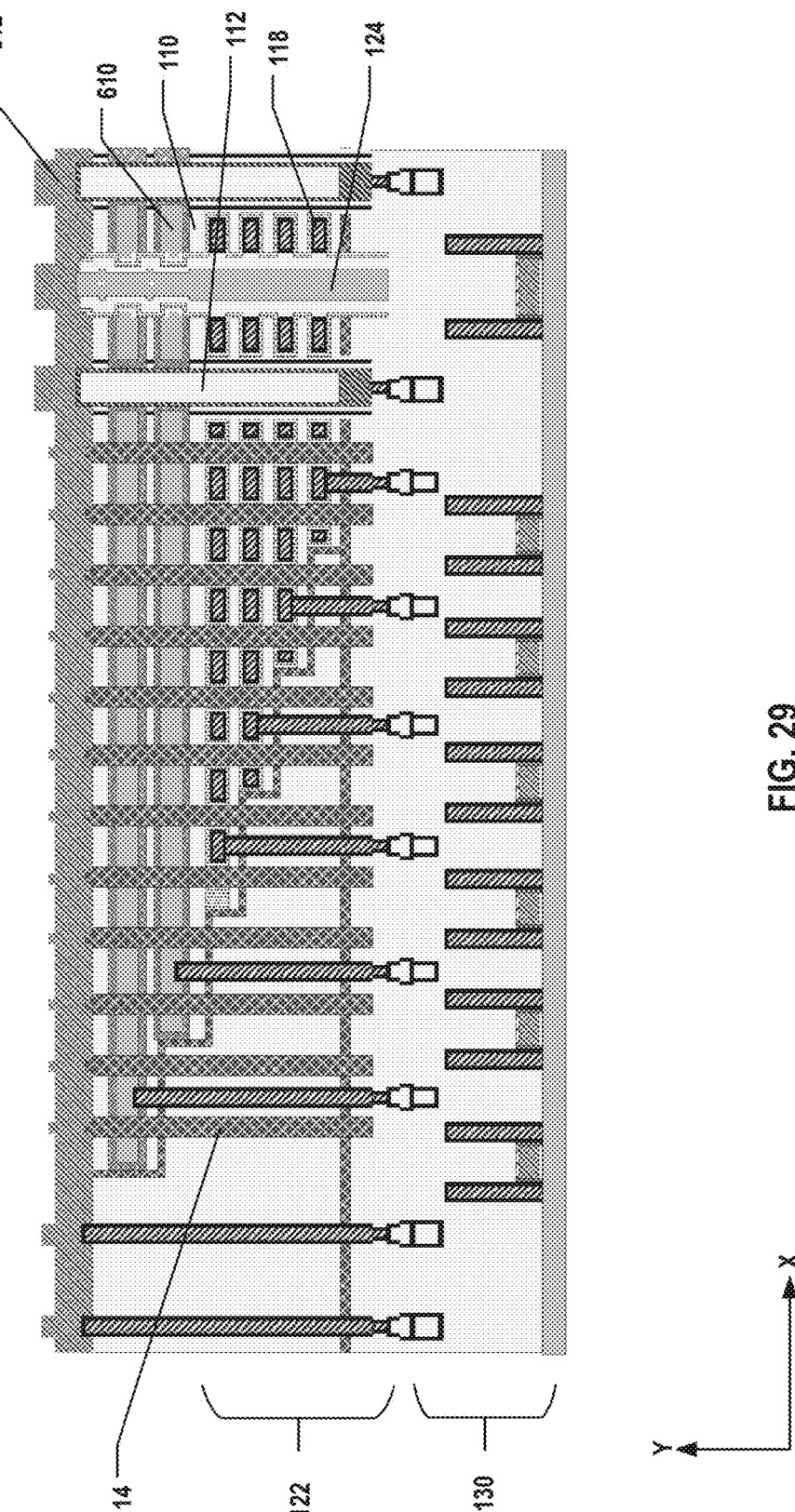

As shown in FIG. 29 and operation 718 in FIG. 31, semiconductor layer 102 and third sacrificial layer 602 are removed to expose a portion of channel structure 112. In some implementations, the removal may be performed from the backside of semiconductor layer 102. In some implementations, semiconductor layer 102 (the carrier substrate) may be first removed, stopping at third sacrificial layer 602. In some implementations, semiconductor layer 102 may be completely removed using CMP, grinding, dry etching, and/or wet etching. In some implementations, semiconductor layer 102 may be peeled off.

Then, third sacrificial layer 602 may be completely removed as well using wet etching with suitable etchants, such as phosphoric acid and hydrofluoric acid. In some implementations, part of channel structure 112 extending into third sacrificial layer 602 is removed, such that semiconductor channel 113 at the upper end (the source end) of channel structure 112 is exposed.

The removal of parts of channel structure 112 from the backside is much less challenging and has a higher production yield compared with the known solutions using front side wet etching via opening 116 through dielectric stack 106/memory stack 122 with a high aspect ratio (e.g., greater than 50). By avoiding the issues introduced by the high aspect ratio of opening 116, the fabrication complexity and cost can be reduced, and the yield can be increased. Also, the vertical scalability (e.g., the increasing level of dielectric stack 106/memory stack 122) can be improved as well.

As shown in FIG. 29 and operation 720 in FIG. 31, a conductive layer is formed over channel structure 112. A doped semiconductor layer 612 is formed on memory stack 122 covering the exposed semiconductor channel 113. In some implementations, to form doped semiconductor layer 612, a semiconductor layer (e.g., polysilicon) may be deposited on memory stack 122 in contact with the exposed semiconductor channel 113 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 612, in-situ doping of N-type dopants, such as P, As, or Sb, is performed when depositing the semiconductor layer on memory stack 122 covering the exposed semiconductor channel 113. In some implementations, a CMP process may be further performed to remove any excess doped semiconductor layer 612 as needed.

In some implementations, doped semiconductor layer 612 and the part of semiconductor channel 113 that is in contact with doped semiconductor layer 612 are locally activated. In some implementations, to locally activate, heat is applied in a confined area having doped semiconductor layer 612 and the part of semiconductor channel 113 to activate dopants in doped semiconductor layer 612 and the part of semiconductor channel 113. The confined area can be between the stack structure and doped semiconductor layer 612. In some implementations, the doping concentration of doped semiconductor layer 612 and the doping concentration of the part of semiconductor channel 113 in contact with doped semiconductor layer 612 each is between $10^{19}$ cm$^{-3}$ and $10^{21}$ cm$^{-3}$ after the activation.

The local activation process can activate the dopants such that the dopants can occupy the silicon lattices to reduce the contact resistance between doped semiconductor layer 612 and semiconductor channel 113 as well as to reduce the sheet resistance of doped semiconductor layer 612. On the other hand, by confining the heat during the local activation process into an area without heat-sensitive structures, any potential damages to the heat-sensitive structures, such as the bonding interface and Cu interconnects used for connecting the peripheral circuits, can be reduced or avoided.

Figure 30:
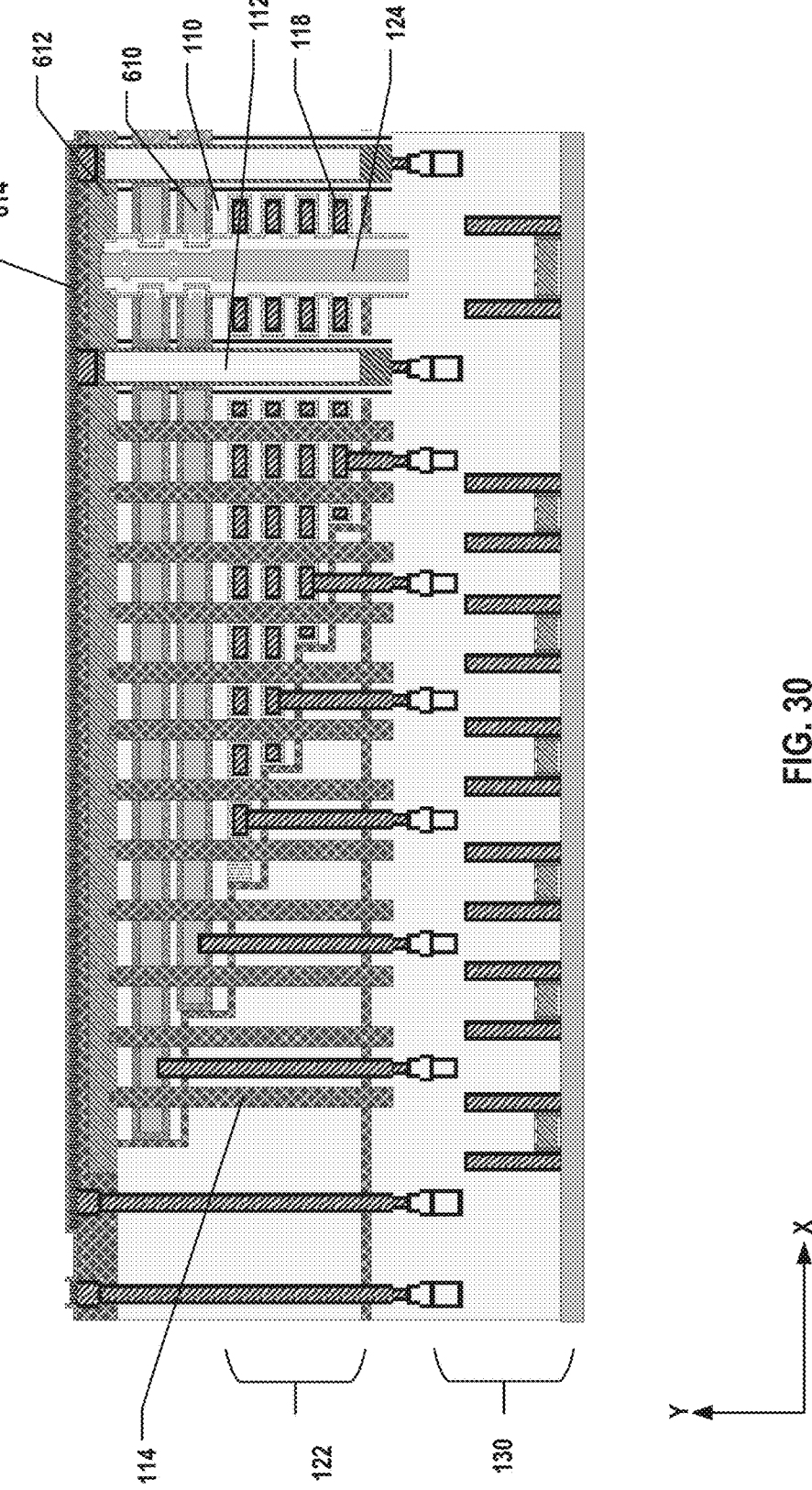

As shown in FIG. 30, a source contact is formed in contact with doped semiconductor layer 612. In some implementations, an interconnection structure 614 may be formed on doped semiconductor layer 612. Interconnection structure 614 may include one or more ILD layers on doped semiconductor layer 612 and a redistribution layer on the ILD layers. The source end of channel structure 112 may be coupled to the redistribution layer through the source contact.

Figure 32:
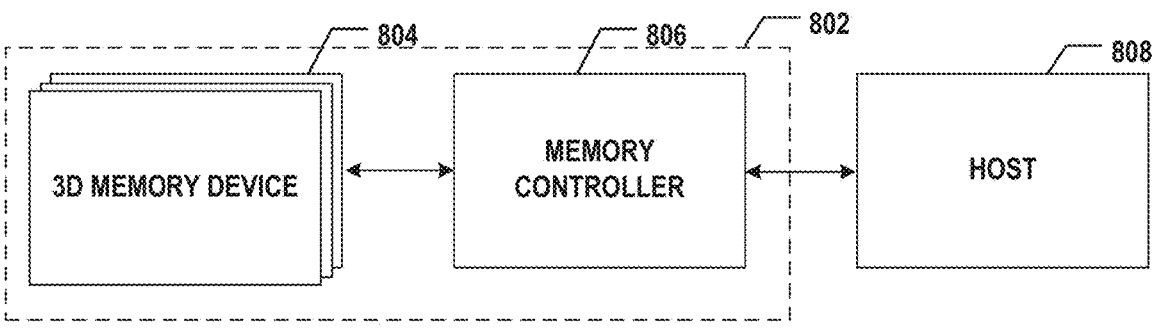
FIG. 32 illustrates a block diagram of an exemplary system having a 3D memory device, according to some aspects of the present disclosure.

FIG. 32 illustrates a block diagram of an exemplary system 800 having a memory device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 32, system 800 can include a host 808 and a memory system 802 having one or more memory devices 804 and a memory controller 806. Host 808 can be a processor of an electronic device, such as a central processing unit (CPU), or a system-on-chip (SoC), such as an application processor (AP). Host 808 can be configured to send or receive data to or from memory devices 804.

Memory device 804 can be any memory device disclosed in the present disclosure. As disclosed above in detail, memory device 804, such as a NAND Flash memory device, may have a controlled and predefined discharge current in the discharge operation of discharging the bit lines. Memory controller 806 is coupled to memory device 804 and host 808 and is configured to control memory device 804, according to some implementations. Memory controller 806 can manage the data stored in memory device 804 and communicate with host 808. For example, memory controller 806 may be coupled to memory device 804, such as 3D memory device 100 described above, and memory controller 806 may be configured to control operations of channel structure 112 of 3D memory device 100 through source select gate line 162. By forming source select gate line 162 in 3D memory device 100 as a CMOS structure, the induced threshold voltage (Vt) shift of the BSG transistor can be prevented. The reliability of memory device 804 can be therefore improved by preventing unpredictable failure caused by the induced threshold voltage (Vt) shift. As a result, the performance of system 800 can be improved.

In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of memory device 804, such as read, erase, and program operations. Memory controller 806 can also be configured to manage various functions with respect to the data stored or to be stored in memory device 804 including, but not limited to bad-block management, garbage collection, logical-to-physical address conversion, wear leveling, etc. In some implementations, memory controller 806 is further configured to process error correction codes (ECCs) with respect to the data read from or written to memory device 804. Any other suitable functions may be performed by memory controller 806 as well, for example, formatting memory device 804. Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 33A:
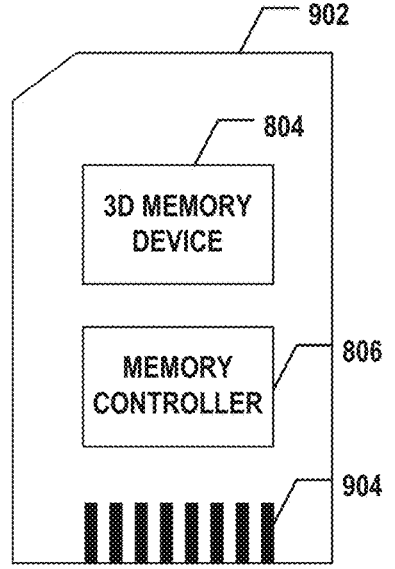
FIG. 33A illustrates a diagram of an exemplary memory card having a 3D memory device, according to some aspects of the present disclosure.
Figure 33B:
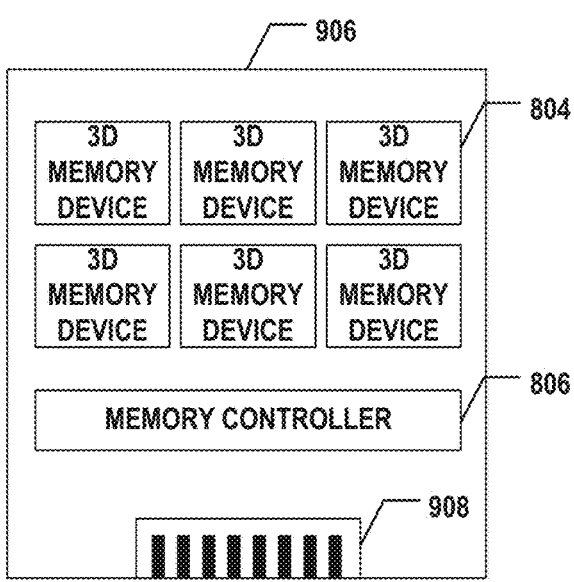
FIG. 33B illustrates a diagram of an exemplary solid-state drive (SSD) having a 3D memory device, according to some aspects of the present disclosure.

Memory controller 806 and one or more memory devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 33A, memory controller 806 and a single memory device 804 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 902 can further include a memory card connector 904 coupling memory card 902 with a host (e.g., host 808 in FIG. 32). In another example as shown in FIG. 33B, memory controller 806 and multiple memory devices 804 may be integrated into an SSD 906. SSD 906 can further include an SSD connector 908 coupling SSD 906 with a host (e.g., host 808 in FIG. 32). In some implementations, the storage capacity and/or the operation speed of SSD 906 is greater than those of memory card 902.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a doped semiconductor layer;
a source select gate line disposed on the doped semiconductor layer, the source select gate line comprising a source select gate conductive layer surrounded by a source select gate dielectric layer;
a stack structure comprising interleaved word lines and dielectric layers formed on the source select gate line, each word line comprising a gate electrode surrounded by a gate dielectric layer;
a channel structure extending through the stack structure and the source select gate line and in contact with the doped semiconductor layer, the channel structure comprising a semiconductor channel and a memory film; and
an interconnection structure in contact with the doped semiconductor layer and under the channel structure,
wherein the source select gate dielectric layer is in contact with the semiconductor channel, and the gate dielectric layer is in contact with the memory film.

2. The 3D memory device of claim 1, wherein the source select gate dielectric layer is between the source select gate conductive layer and the semiconductor channel.

3. The 3D memory device of claim 1, wherein the gate dielectric layer and the memory film are between the gate electrode and the semiconductor channel.

4. The 3D memory device of claim 1, wherein the source select gate dielectric layer is in direct contact with the semiconductor channel.

5. The 3D memory device of claim 1, wherein the source select gate conductive layer comprises polysilicon.

6. The 3D memory device of claim 1, wherein the interconnection structure comprises:
an interlayer dielectric layer on the doped semiconductor layer; and
a redistribution layer on the interlayer dielectric layer.

7. The 3D memory device of claim 1, wherein a source end of the channel structure is coupled to the interconnection structure through a source contact.

8. The 3D memory device of claim 1, wherein the source select gate dielectric layer comprises high-k dielectric material.

9. The 3D memory device of claim 1, wherein the gate electrode and the source select gate conductive layer are formed by a same material.

10. The 3D memory device of claim 1, wherein the semiconductor channel is in direct contact with the doped semiconductor layer.

11. A three-dimensional (3D) memory device, comprising:

a doped semiconductor layer;

a source select gate line disposed on the doped semiconductor layer, the source select gate line comprising a source select gate conductive layer surrounded by a source select gate dielectric layer;

a stack structure comprising interleaved word lines and dielectric layers formed on the source select gate line, each word line comprising a gate electrode surrounded by a gate dielectric layer;

a channel structure extending through the stack structure and the source select gate line and in contact with the doped semiconductor layer, the channel structure comprising a semiconductor channel and a memory film; and an interconnection structure in contact with the doped semiconductor layer and under the channel structure, wherein the semiconductor channel comprises an undoped polysilicon layer; and wherein the source select gate dielectric layer is in contact with the undoped polysilicon layer, and the gate dielectric layer is in contact with the memory film.

12. The 3D memory device of claim 11, wherein the source select gate dielectric layer is in direct contact with the semiconductor channel.

13. The 3D memory device of claim 11, wherein the source select gate dielectric layer is in direct contact with the undoped polysilicon layer.

14. The 3D memory device of claim 11, wherein the source select gate dielectric layer is between the source select gate conductive layer and the semiconductor channel.

15. The 3D memory device of claim 11, wherein the gate dielectric layer and the memory film are between the gate electrode and the semiconductor channel.

16. The 3D memory device of claim 11, wherein the source select gate conductive layer comprises polysilicon.

17. The 3D memory device of claim 11, wherein the interconnection structure comprises:

an interlayer dielectric layer on the doped semiconductor layer; and a redistribution layer on the interlayer dielectric layer.

18. The 3D memory device of claim 11, wherein the source select gate dielectric layer comprises high-k dielectric material.

19. The 3D memory device of claim 11, wherein the gate electrode and the source select gate conductive layer are formed by a same material.

20. The 3D memory device of claim 11, wherein the semiconductor channel is in direct contact with the doped semiconductor layer.

* * * * *